US007405092B2

(12) United States Patent
Nishimura

(10) Patent No.: US 7,405,092 B2
(45) Date of Patent: Jul. 29, 2008

(54) METHOD OF MANUFACTURING ELECTRON-EMITTING DEVICE AND METHOD OF MANUFACTURING IMAGE DISPLAY APPARATUS

(75) Inventor: Michiyo Nishimura, Kanagawa (JP)

(73) Assignee: Canon Kabushiki Kaisha, Tokyo (JP)

(*) Notice: Subject to any disclaimer, the term of this patent is extended or adjusted under 35 U.S.C. 154(b) by 0 days.

(21) Appl. No.: 10/885,803

(22) Filed: Jul. 8, 2004

(65) Prior Publication Data

US 2005/0017651 A1 Jan. 27, 2005

(30) Foreign Application Priority Data

Jul. 25, 2003 (JP) ............................ 2003-201590

(51) Int. Cl.
*H01L 21/00* (2006.01)

(52) U.S. Cl. ............................ 438/20; 438/22; 438/29; 438/69; 257/13; 257/918; 257/E31.095; 257/E31.096; 313/346 R

(58) Field of Classification Search ................... 438/20, 438/22, 69, 29; 313/310, 346 R; 257/13, 257/918, E31.095, E31.096

See application file for complete search history.

(56) References Cited

U.S. PATENT DOCUMENTS

| | | | | |
|---|---|---|---|---|
| 5,180,951 | A | 1/1993 | Dworsky et al. | 315/169.3 |
| 5,283,501 | A | 2/1994 | Zhu et al. | 315/169.3 |
| 6,091,186 | A * | 7/2000 | Cao et al. | 313/310 |
| 6,225,749 | B1 | 5/2001 | Kobayashi et al. | 315/169.3 |
| 6,231,412 | B1 | 5/2001 | Kawade et al. | 445/3 |
| 6,267,636 | B1 | 7/2001 | Onishi et al. | 445/6 |
| 6,379,211 | B2 | 4/2002 | Onishi et al. | 445/73 |
| 6,380,914 | B1 | 4/2002 | Xie | 345/75.2 |
| 6,388,384 | B1 | 5/2002 | Pierrejean | 315/111.81 |
| 6,409,563 | B1 | 6/2002 | Tamura et al. | 445/3 |
| 6,490,433 | B1 | 12/2002 | Kawade | 455/6 |
| 6,821,174 | B2 | 11/2004 | Kaneko et al. | 445/6 |
| 6,848,962 | B2 * | 2/2005 | Kitamura et al. | 445/24 |
| 6,861,790 | B1 | 3/2005 | Iwasa et al. | 313/346 R |
| 2002/0060514 | A1 | 5/2002 | Nakamoto | 313/311 |
| 2002/0074947 | A1 * | 6/2002 | Tsukamoto | 315/169.3 |

(Continued)

FOREIGN PATENT DOCUMENTS

EP 0 785 564 7/1997

(Continued)

OTHER PUBLICATIONS

D.P. Monaghan, K.C.Laing, P.A. Logan, P.Teer and D.G. Teer.General "property of Diamond- like coating", Mterials world, vol. 1 No. 6 pp. 347-349, Jun. 1993.*

(Continued)

*Primary Examiner*—W. David Coleman
*Assistant Examiner*—Su C Kim
(74) *Attorney, Agent, or Firm*—Fitzpatrick, Cella, Harper & Scinto

(57) ABSTRACT

A method of manufacturing an electron-emitting device with a stable electrical characteristics without variation per each of the devices is provided, by forming, on a substrate, a cathode electrode, a carbon layer on the cathode electrode, and a gate electrode, disposing an anode electrode, and applying to the carbon layer a voltage higher than that at a driving of the electron-emitting device.

36 Claims, 10 Drawing Sheets

U.S. PATENT DOCUMENTS

2002/0177032 A1 * 11/2002 Suenaga et al. ............... 429/44

FOREIGN PATENT DOCUMENTS

| | | | |
|---|---|---|---|
| EP | 0 977 235 | | 2/2000 |
| EP | 1 443 538 | A2 | 8/2004 |
| JP | 8-96703 | | 4/1996 |
| JP | 09-035670 | | 2/1997 |
| JP | 9-185942 | | 7/1997 |
| JP | 9-199001 | | 7/1997 |
| JP | 09-270227 | | 10/1997 |
| JP | 3062987 | | 5/2000 |
| JP | 3094459 | | 8/2000 |
| JP | 2001-006523 | | 1/2001 |
| JP | 2002-100278 | | 4/2002 |
| JP | 2002-150929 | | 5/2002 |
| JP | 2002-175756 | | 6/2002 |

OTHER PUBLICATIONS

V.V. Zhirnov et al., *Environmental Effect on the Electron Emission from Diamond Surfaces*, J. Vac. Sci. Technol. B16(e), May/Jun. 1998, American Vacuum Society, pp. 1188-1193.

* cited by examiner

METHOD OF MANUFACTURING ELECTRON-EMITTING DEVICE AND METHOD OF MANUFACTURING IMAGE DISPLAY APPARATUS

This application claims priority from Japanese Patent Application No. 2003-201590 filed Jul. 25, 2003, which is hereby incorporated by reference.

BACKGROUND OF THE INVENTION

1. Field of the Invention

The present invention relates to a method of manufacturing an electron-emitting device using an electron-emitting film, a method of manufacturing an electron source including a large number of electron-emitting devices, and a method of manufacturing an image display apparatus including a large number of electron-emitting devices.

2. Related Background Art

An electron-emitting device includes a field emission type (FE-type) electron-emitting device, an MIM type electron-emitting device, and a surface conduction electron-emitting device. With respect to the FE-type, there is a configuration which is called a spindt type, in which an opening is formed in a gate electrode and a metallic member is tapered (formed in a cone shape) in the opening. In addition, there is a configuration in which electrons are emitted from a relatively flat diamond thin film (electron-emitting film) located in an opening as disclosed in JP 08-096703 A or the like.

As an application apparatus using those electron-emitting devices, there is, for example, a flat panel display in which the multiple electron-emitting devices described above are arranged on the same substrate. When a large number of electron-emitting devices to be utilized are arranged as in the flat panel display, it is important to set electron-emitting characteristics (in particular, voltage-current characteristics) of the respective electron-emitting devices uniform.

Therefore, with respect to an example using the spindt type electron-emitting device, a method of equalizing curvatures of the tips of respective emitters using electric field evaporation is disclosed in JP 3094459 B. With respect to an example using the surface conduction electron-emitting device, a method of uniformalizing characteristics of respective electron-emitting devices by applying a voltage to each of the electron-emitting devices after the completion of an operation which is called “activation process” is disclosed in JP 3062987 B.

An electron-emitting device using a diamond having negative electron affinity as an electron-emitting member is disclosed in JP 09-199001 A, U.S. Pat. No. 5283501 B, U.S. Pat. No. 5180951 B, and V. V. Zhinov, J. Liu, et al., “Environmental effect on the electron emission from diamond surfaces”, J. Vac. Sci. Technol., B16(3), May/June 1998, pp.1188-1193).

SUMMARY OF THE INVENTION

In recent years, there is a demand for the flat panel display having higher resolution. Therefore, controlling a electron beam trajectory of an electron-emitting device and reducing a beam spot size (width) of the electron beam are required.

When the beam spot size is reduced precisely, it is advantageous to set a drive electric field (threshold electric field required to emit electrons) to a low value in some cases. Note that, when the tip of an electron-emitting member is tapered as in the above-mentioned spindt type, an emitted electron beam is diffused owing to such a shape, so that the electron beam spot size on an anode will be wide in some cases. When the tip of the electron-emitting member is relatively flat, there is an advantage that the diffusion of the beam can be suppressed.

A thin electron-emitting film is advantageous in manufacturing process using photolithography process and in maintaining high adhesiveness or the like. A small surface roughtness of the electron-emitting device enables a reducing of its surface area, a decreasing of an absorption of water, or the like. Therefore, when an electron source or an image display apparatus is manufactured by using a plurality of the electron-emitting devices each of which comprises the thin electron-emitting film, there are advantages that forming and maintining an ultra-high-vacuum is relatively easy.

However, with respect to the electron-emitting device using the thin electron-emitting film whose surface is relatively flat with the above-mentioned advantages, when a large number of the electron-emitting devices are arranged on a substrate, a variation in electron-emitting-characteristics of the respective electron-emitting devices is caused in many cases.

It has been desired to develop an electron-emitting film capable of stably maintaining higher electron-emitting efficiency for a longer time at a lower drive voltage.

An object of the present invention is to provide a method of manufacturing an electron-emitting device in which a drive voltage is low, a beam diameter is well controlled, and a carbon film having a merit in its production is used. Further, another object of the present invention is to provide a method of manufacturing an electron source or an image forming apparatus with high uniformity which are using the electron-emitting device.

According to a first aspect of the present invention, there is provided a method of manufacturing an electron-emitting device, including the steps of:

(A) preparing an electron-emitting device including a cathode electrode located on a substrate surface, a carbon layer located on the cathode electrode, and an extraction electrode located apart from the cathode electrode, wherein the electron-emitting device emits an electron from the carbon layer in a direction in which the cathode electrode and the carbon layer are stacked; and (B) applying a voltage higher than a voltage applied between the extraction electrode and the cathode electrode at driving of the electron-emitting device between the extraction electrode and the cathode electrode.

The manufacturing method according to the first aspect of the-present invention includes the following structure as preferred aspects:

A Root-Mean-Square surface roughness of the carbon layer is equal to or smaller than 1/10 of a film thickness of the carbon layer or a Root-Mean-Square surface roughness of the carbon layer is equal to or smaller than 10 nm;

the electron-emitting device has a dipole layer at a surface or on a surface of the carbon layer and the dipole layer includes hydrogen terminating the surface of the carbon layer; and the carbon layer includes a carbon base and a plurality of electroconductive particles dispersed in the carbon base and the electroconductive particles are arranged to constitute aggregations in a thickness direction of the carbon layer, and a resistivity of the carbon base is higher than that of the electroconductive particles.

Also, the method of manufacturing the electron-emitting device according to the present invention can be preferably applied to a method of manufacturing an electron source including a plurality of electron-emitting devices and a method of manufacturing an image display apparatus including the electron source and a light emitting member.

According to a second aspect of the present invention, there is provided a method of manufacturing an image display apparatus including an anode electrode and a plurality of electron-emitting devices, each of which is located apart from the anode electrode and located on a substrate surface, including the steps of:

(A) preparing a plurality of electron-emitting devices on a substrate surface;

(B) selecting an electron-emitting device from the plurality of electron-emitting devices; and (C) applying a voltage higher than a voltage applied at driving of the selected electron-emitting device between a gate electrode and a cathode electrode of the selected electron-emitting device, each of the plurality of electron-emitting devices including the cathode electrode located on the substrate surface, a carbon layer located on the cathode electrode, and the gate electrode located apart from the cathode electrode, wherein each of the plurality of electron-emitting devices emits an electron from the carbon layer in a direction in which the cathode electrode and the carbon layer are stacked.

The manufacturing method according to the second aspect of the present invention includes the following structure as preferred aspects:

the (C) step is performed to reduce a differences of electron-emitting characteristics among the plurality of electron-emitting devices;

the carbon layer has a dipole layer at a surface or on a surface of the carbon layer;

the surface of the carbon layer is terminated with hydrogen;

the carbon layer includes a carbon base and a plurality of electroconductive particles dispersed in the carbon base; and the electroconductive particles are arranged to constitute aggregations in a thickness direction of the carbon layer, and a resistivity of the carbon base is higher than that of the electroconductive particles.

According to a third aspect of the present invention, there is provided a method of manufacturing an image display apparatus including a plurality of electron-emitting devices and a light-emitting member, including the steps of:

preparing a first substrate on which the plurality of electron-emitting devices are disposed and a second substrate on which a phosphor is disposed so that the first and the second substrates face each other; and connecting a drive voltage supply circuit to the plurality of electron-emitting devices for supplying a drive voltage generated from the drive voltage supply circuit to each of the plurality of electron-emitting devices, wherein each of the plurality of electron-emitting devices includes a cathode electrode on which, a carbon layer is disposed, hydrogen terminating a surface of the carbon layer, and a gate electrode located apart from the cathode electrode.

According to a fourth aspect of the present invention, there is provided a method of driving an image display apparatus including a plurality of electron-emitting devices and a light-emitting member, wherein a drive voltage applied to each of the plurality of electron-emitting devices is equal to or smaller than a voltage applied to each of the plurality of electron-emitting devices at manufacturing of the plurality of electron-emitting devices, wherein each of the plurality of electron-emitting devices comprises a cathode electrode on which a carbon layer is disposed, hydrogen terminating a surface of the carbon layer, and a gate electrode located apart from the cathode electrode.

According to a fifth aspect of the present invention, there is provided an image display apparatus, including:

a plurality of electron-emitting devices;

a light-emitting member; and a drive circuit generating a drive voltage which is supplied to the plurality of electron-emitting devices at driving of the image display apparatus, wherein the voltage is equal to or smaller than a voltage applied to each of the plurality of electron-emitting devices in a manufacturing process of each of the plurality of electron-emitting devices, and wherein each of the plurality of electron-emitting devices includes a cathode electrode on which a carbon layer is disposed, hydrogen terminating a surface of the carbon layer, and a gate electrode located apart from the cathode electrode.

DESCRIPTION OF THE PREFERRED EMBODIMENTS

Hereinafter, the present invention will be described with reference to the drawings. Note that, with respect to sizes, materials, shapes, relative arrangements, and the like of respective members, a drive method and a drive voltage which are related to them, and the like in the following embodiment, they should not be construed as limiting the scope of the present invention.

An electron-emitting device of the present invention includes at least: (a) a cathode electrode located on-a substrate and a carbon layer (electron-emitting film) stacked on the cathode electrode; and (b) an extraction electrode (gate electrode and/or anode electrode). Note that the cathode electrode in the present invention indicates an electroconductive member for supplying electrons emitted to a vacuum, which is connected with the carbon layer.

Figure 1A:
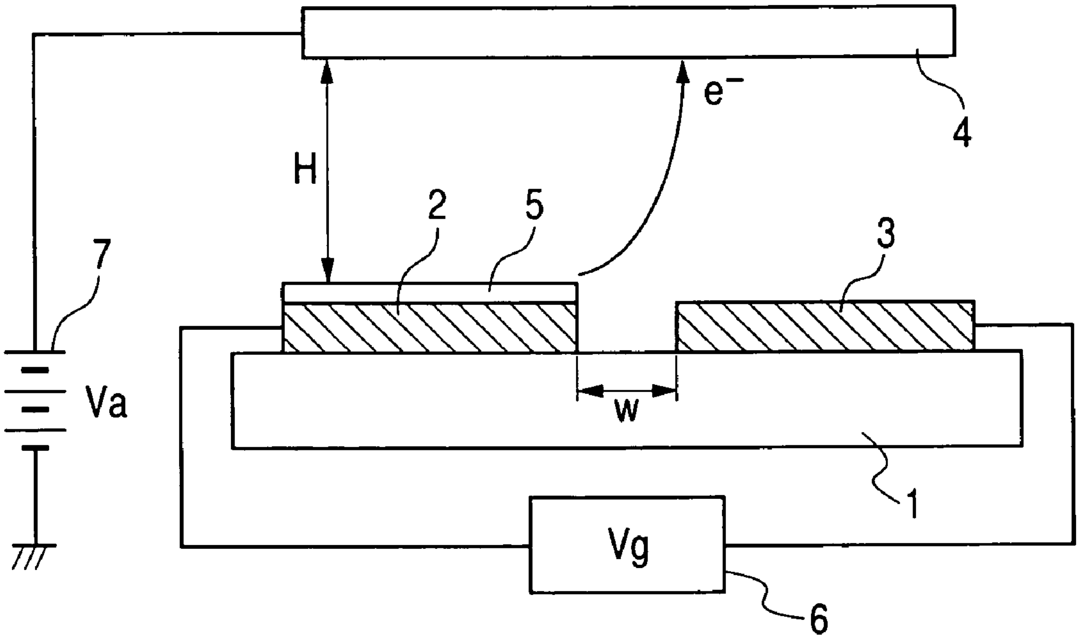
FIGS. 1A and 1B are schematic views showing an example of an electron-emitting device according to the present invention.
Figure 1B:
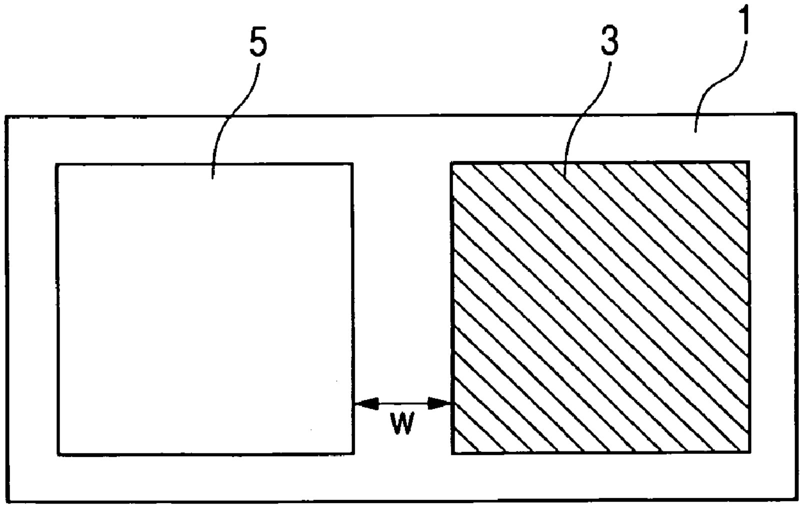

FIGS. 1A and 1B show a preferred embodiment of the electron-emitting device of the present invention. FIG. 1A is a schematic cross sectional view showing the electron-emitting device in a driving state and FIG. 1B is a schematic plan view showing the electron-emitting device. In FIGS. 1A and 1B, reference numeral 1 denotes a substrate, 2 denotes a cathode electrode, 3 denotes a gate electrode, 4 denotes an anode electrode, 5 denotes a carbon layer serving as an electron-emitting film, 6 denotes a drive power source (voltage source), and 7 denotes an anode power source (anode voltage source). In the electron-emitting device, when a drive voltage Vg [V] is applied between the cathode electrode 2 and the gate electrode 3 and simultaneously a voltage Va [V] higher than Vg is applied to the anode electrode 4, electrons are emitted from the carbon layer 5, so that an emission current Ie [A] flows.

In the example shown in FIGS. 1A and 1B, a triode structure is used. A so-called "diode" structure in which the gate electrode 3 is omitted from the structure shown in FIG. 1A may be also used in present invention. In this case, the anode electrode 4 functions as the extraction electrode.

The carbon layer 5 is an electron-emitting layer mainly containing carbon. A drive electric field to the carbon-layer 5 (electric field intensity required for electron emission from the carbon layer 5) can be reduced as compared with a film mainly containing metal such as molybdenum generally used in the spindt type or the like. The layer mainly containing carbon (electron-emitting layer) indicates a layer in which a carbon content is highest. As regards another elements, as described later, the electron-emitting layer may contain metallic particles and the electron-emitting layer may contain hydrogen. Of course, the present invention does not exclude a layer made of only carbon.

Figure 2:
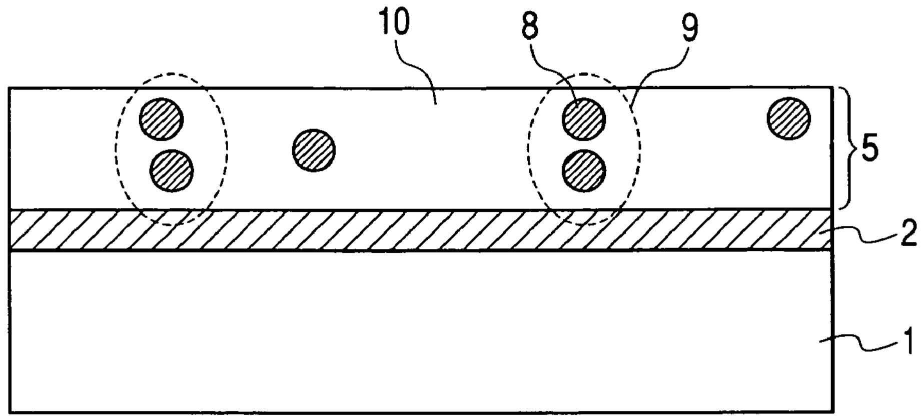
FIG. 2 is a schematic sectional view showing a preferred example of a carbon layer of the electron-emitting device according to the present invention.

In particular, as schematically shown in FIG. 2, a carbon layer 5 in which the large number of electroconductive particles 8 are contained in a carbon base 10 is preferable as the carbon layer 5. A resistivity of the carbon base 10 is set to a value higher than a resistivity of the electroconductive particles 8. Therefore, typically, the carbon base 10 is made of a dielectric and the electroconductive particles 8 is made of an electrical conductor such as metals. The resistivity of the carbon base 10 is desirably set to a value equal to or larger than 100 times as high as the resistivity of the electroconductive particles 8. Therefore, electron emission can be caused with a lower electric field. Note that the carbon base 10 indicates a member in which the electroconductive particles 8 are removed from the carbon layer 5, which mainly contains carbon. In some cases, the carbon base 10 contains a metallic element or hydrogen. The case where the carbon base 10 is made of only carbon is not excluded.

Metallic particles are preferably used as the electroconductive particles 8 in the structure shown in FIG. 2. Elements belonging to VIII group are preferable as metal species. Further, a metal having a catalytic property to carbon is preferable. Therefore, it is preferable that the electroconductive particles 8 contain at least one of metals selected from Co, Ni, and Fe. In particular, Co is preferable. A band gap difference between carbon and Ni, Fe, or Co is small, so that a trouble in electron injection is less. In order to more stably realize a larger emission current density, it is preferable that the electroconductive particles 8 mainly contain single crystals of the metal.

In the case of this configuration, the resistivity of the carbon base 10 is preferably in the range of $1\times10$ Ωcm to $1\times10^{14}$ Ωcm, more preferably in the range of $1\times10^{7}$ Ωcm to $10^{14}$ Ωcm. The carbon layer 5 preferably has both $sp^2$ bond and $sp^3$ bond. In particular, in the case of the carbon layer having a structure with $sp^3$ bond and a micro structure of graphite (graphenes), an electron-emitting characteristic is inherently satisfactory even when an electric field concentration is low. Therefore, when the electroconductive particles 8 are located in the carbon base 10 so as to obtain a structure described later, a further effect of an electric field concentration can be provided, so that a particularly preferable electron-emitting characteristic can be realized. As described above, the carbon layer 5 itself must have a high resistance, so it is important that the carbon layer 5 acts as an insulator substantially. When a main component of the carbon layer 5 is amorphous carbon such as diamond like carbon (DLC), the resistivity of $1\times10$ Ωcm to $1\times10^{14}$ Ωcm can be obtained, so that the carbon layer 5 can act as a dielectric. Thus the main component of the carbon layer 5 is preferably constituted from amorphous carbon.

In the structure shown in FIG. 2, the plurality of electroconductive particles 8 are not necessarily uniformly dispersed in the carbon base 10. As shown in FIG. 2, some of the electroconductive particles 8 compose an aggregation (some of the electroconductive particles 8 form a group) 9. The aggregations (groups) 9 are discretely arranged in the carbon base 10. An interval among the respective aggregations (groups) 9 is preferably equal to or larger than an average film thickness of the carbon layer 5. Note that the average film thickness of the carbon layer 5 is defined using a surface of the cathode electrode 2 or a surface of the substrate 1 as a reference. The interval (interval among the respective aggregations (groups) 9) is specifically one or more times as large as the average film thickness of the carbon layer 5, preferably 1.5 times to 1000 times as large as the average film thickness of the carbon layer 5. When the interval exceeds this range, an emission site density (ESD) in the carbon layer 5 is hard to satisfy the characteristics of the electron-emitting device, the characteristic being required for an image display apparatus, which is impractical.

Therefore, when the respective aggregations (groups) 9 are sufficiently apart from one another, a threshold electric field (threshold voltage) required for electron emission can be reduced. This is because there is an effect that the electric field concentration to the respective aggregations (groups) 9 increases by separating the aggregations (groups) 9 from one another. Note that, in the present invention, as shown in FIG. 2, the electroconductive particle 8 which does not compose the aggregation (groups) 9 may be also present among the respective aggregations (groups) 9.

The plurality of electroconductive particles 8 composing each of the aggregations 9 are substantially arranged in a film thickness direction of the carbon layer 5 (direction from the cathode electrode 2 side to a surface side of the carbon layer 5). Therefore, the electric field can be concentrated on the respective aggregations 9.

The number of electroconductive particles 8 arranged in the film thickness direction of the carbon layer 5 is not limited and may be at least two. For example, when two adjacent particles are arranged in the film thickness direction of the carbon layer 5, one of the two adjacent particles may be located at a position nearer the surface of the cathode electrode 2 (or the surface of the carbon layer 5) than the other thereof. However, when a threshold value for electron emission is further reduced, it is preferable to arrange at least three particles in the film thickness direction of the carbon layer 5. In particular, the particles are preferably arranged perpendicular to the surface of the cathode electrode 2 (the surface of the carbon layer 5).

It is preferable that the adjacent electroconductive particles 8 in each of the aggregations 9 are arranged within a range of 5 nm or less. When an interval between the adjacent electroconductive particles 8 exceeds this range, the threshold value (threshold electric field or threshold voltage) for electron emission begins to significantly increase, so that it is hard to obtain a sufficient emission current. The adjacent particles in each of the aggregations 9 may be in contact with each other. When the interval between the adjacent particles exceeds an average particle size to cause a space, an electric field is hard to concentrate, which is not preferable. According to the present invention, the electrical conductor contained in the carbon layer 5 is particulate. Therefore, even if the adjacent particles are in contact with each other, a resistance between the adjacent particles becomes higher. Thus, a significant increase in emission current at each emission site present in the carbon layer 5 can be suppressed, so that it is expected that electron emission can be stably caused.

It is preferable that the electroconductive particles 8 are substantially completely buried in the carbon layer 5. A part of the electroconductive particles 8 may be exposed on the surface of the carbon layer 5. Therefore, it is preferable that a Root-Mean-Square surface roughness of the carbon. layer 5 is equal to or smaller than 1/10 of the average film thickness of the carbon layer 5. Note that the "Root-Mean-Square" defined in Japan Industrial Standard (JIS) may be also applied to this invention. According to the structure, the diffusion (divergence) of an electron beam resulting from the surface roughness of the carbon layer 5 can be minimized. In addition, according to the structure, the surfaces of the electroconductive particles 8 are not almost affected by gases present in a vacuum. Therefore, it is expected that the structure contributes to the stable electron emission.

With respect to the electron-emitting device having the above-mentioned structure, it is expected that conductive paths which are composed of the electroconductive particles 8 made of the electrical conductor are partially (discretely) formed in the carbon base 10 made of the dielectric. Therefore, it is not necessary for the carbon layer 5 having the flat surface to receive preprocessing such as conditioning required in a conventional case, so that preferable electron emission can be realized without partial breaking or damaging. Note that, when the electroconductive particles 8 are uniformly dispersed over the entire carbon layer 5, the carbon layer 5 becomes a mere electroconductive film and hence, the threshold electric field intensity (threshold voltage) for electron emission becomes higher. When the interval among the respective aggregations 9 is too large, it is impossible to obtain the emission current required for an electron-emitting device used in a display and the emission site density required to stabilize the emission current. As a result, the electron emission cannot be stabilized and a stable display image cannot be obtained. Thus, the density of the electroconductive particles 8 in the carbon layer 5 is preferably $1\times10^{14}/cm^3$ to $5\times10^{18}/cm^3$. When the density is $1\times10^{15}/cm^3$ to $5\times10^{17}/cm^3$, the electron emission with a lower electric field can be realized. For the same reason, a practical range of a concentration ratio of a main element of the electroconductive particles 8 to a main element of the carbon base 10 is 0.001 atm % to 1.5 atm %. When the concentration ratio is 0.05 atm % to 1 atm %, the electron emission with a lower electric field can be realized. When the concentration ratio exceeds 1.5 atm %, the threshold electric field intensity (threshold voltage) for electron emission becomes higher as described above. In addition, an applied drive voltage becomes higher, with the result that discharge breakdown may be caused or the sufficient emission site density is not obtained. Therefore, the emission current density required for an image display apparatus cannot be ensured.

Figure 3:
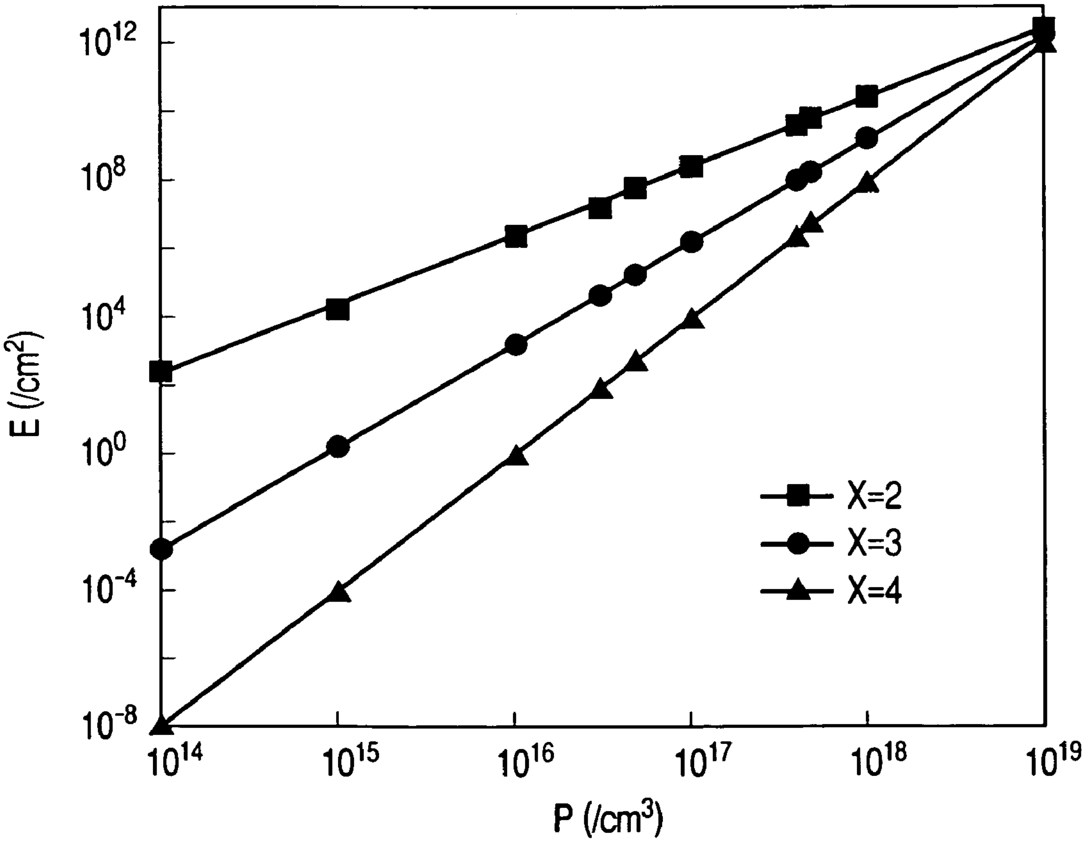
FIG. 3 is a graph showing a relationship between a density of electroconductive particles and the number of aggregations of the particles in the carbon layer of the electron-emitting device according to the present invention.
Figure 4:
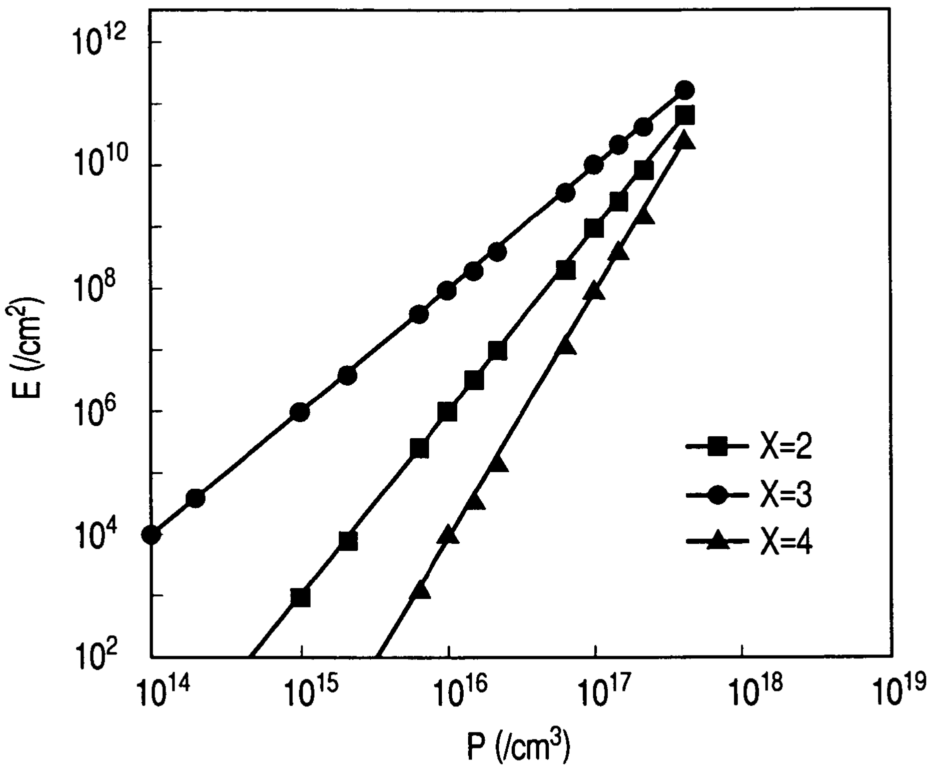
FIG. 4 is a graph showing the relationship between the density of the electroconductive particles and the number of aggregations of the particles in the carbon layer of the electron-emitting device according to the present invention.

Here, the above-mentioned numerical ranges will be described. FIGS. 3 and 4 show the number of aggregations 9 present in the carbon layer 5, as a function of the density of the electroconductive particles 8. Note that X in FIGS. 3 and 4 denotes the number of electroconductive particles 8 composing the single aggregation 9.

Assume that the density of the electroconductive particles 8 in the carbon layer 5 is $P/cm^3$, the film thickness of the carbon layer 5 is represented by h, and the average radius of the electroconductive particle 8 is represented by r. In these conditions, when regions (aggregations 9) in which the electroconductive particles 8 are arranged with one another in the film thickness direction are produced, the number of regions (aggregations 9) E is $2rP(8r^3P)^{(h/2r-1)}/cm^2$. FIG. 3 is a graph at r=2 nm and FIG. 4 is a graph at r=5 nm. Here, r indicates a value half the average particle size of the electroconductive particle 8. Although described in detail later, the average particle size is preferably 1 nm to 10 nm.

It is preferable that E is set to a large value at the density that an electric field can be concentrated on the aggregations (groups) 9. For electric field enhanceemt, at least two electroconductive particles 8 are preferably arranged in the film thickness direction, and the number of aggregations E is set to $1\times10^2/cm^2$, preferably, $1\times10^4/cm^2$. To realize E is $1\times10^2/cm^2$ or more, it is preferable to satisfy at least $P=1\times10^{14}/cm^3$ in the case of r=2 nm. In order that E becomes $1\times10^4/cm^2$ or more, it is preferable to satisfy at least $P=1\times10^{14}/cm^3$ in the case of r=5 nm. On the other hand, when P exceeds $5\times10^{18}/cm^3$, the too many electroconductive particle 8 are arranged, so that the carbon layer 5 becomes a mere electrical conductor or it is hard to cause the electric field concentration on the aggregations 9. Therefore, the ESD (emission site density) becomes smaller and the current density reduces, which reductions are not preferable with respect to the electron-emitting characteristic.

Although depending on the film thickness of the carbon layer 5 and the size of the electroconductive particle 8, when the size of the electroconductive particle 8 is controlled to be several nm and the film thickness of the carbon layer 5 is set to several tens of nm, a substantial range of P is preferably set as follows: $1\times10^{14}/cm^3 \leqq P \leqq 5\times10^{18}/cm^3$. When the average size (2r) of the electroconductive particle 8 is 1 nm to 10 nm and the main element of the electroconductive particle 8 is Co, a concentration of Co in the carbon layer 5, which satisfies the above-mentioned conditions becomes 0.001 atm % to 1.5 atm %. An ideal range of P is preferably such that $1\times10^{15}/cm^3 \leqq P \leqq 5\times10^{17}/cm^3$. In the example shown in FIG. 3, when each of the aggregations 9 is composed of at least two electroconductive particles 8 overlapping with each other, the number of aggregations 9 (E) is $1\times10^4/cm^2$ to $1\times10^{10}/cm^2$.

Figure 5:
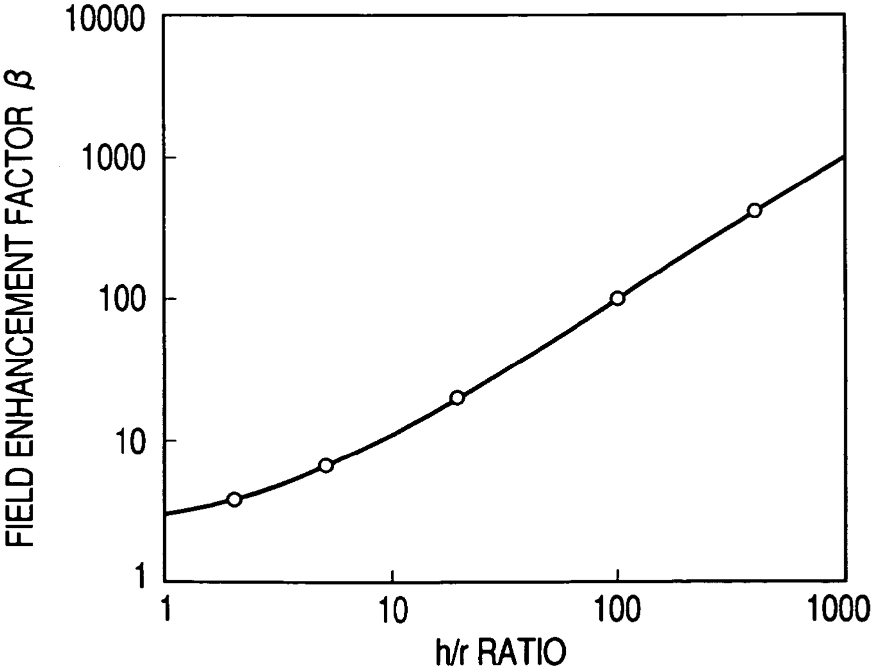
FIG. 5 is a graph showing a relationship between an h/r ratio and a field enhancement factor β in the carbon layer of the electron-emitting device according to the present invention.

Here, the electric field concentration will be described with reference to FIG. 5. When a height of the conductive path is represented by h and a radius of an electron-emitting region is represented by r, an electric field of (2+h/r) times concentrates. Similarly, an electric field of a field enhancement factor β concentrates because of a micro shape at the tip of the conductive path. Therefore, an electric field of (2+h/r)β in total concentrates. Thus, when the above-mentioned configuration is used, it is expected that an electron-emitting film which is easier to emit electrons is formed in the electron-emitting device of the present invention.

On the other hand, a shape of an emitted beam depends on designs such as the film thickness of the carbon layer 5, a size and a shape of the electroconductive particle 8, and an intensity of an electric field. When a non-diffused beam is produced, it is preferable that the carbon layer 5 is thin and the film thickness thereof is 100 nm or less. In addition, a structural stress is small, so that the thin carbon layer 5 is suitable to a thin film process. When the size of the electroconductive particle 8 and the film thickness of the carbon layer 5 are increased at the same rate, a distance among the aggregations 9 becomes larger to reduce the number of emission sites per unit area. It is ideal that the size of the electroconductive particle 8 to the film thickness of 100 nm or less is several nm (1 nm to 10 nm). Therefore, it is preferable to use a configuration in which several electroconductive particles 8 are arranged from the cathode electrode 2 side to the surface of the carbon layer 5.

When the carbon layer 5 contains hydrogen, a stress of the carbon layer 5 may be relaxed. For example, a film mainly containing carbon such as DLC has a high hardness and a strong stress. Therefore, the suitability of a process including heat treatment is not necessarily preferable to the carbon film mainly contains DLC. Even when the film has a high quality with respect to the electron-emitting film, there is also a problem in that the film cannot be used for the electron-emitting device and the electron source in the case where a process is unstable. Therefore, it is also important that a stable film can be formed in process manufacturing because of stress relaxation caused by hydrogen. When 0.1 atm % or more of hydrogen with respect to carbon in the carbon layer 5 is contained in the carbon layer 5, the stress relaxation can be caused. In particular, when 1 atm % or more of hydrogen is contained in the carbon layer 5, the relaxation effect will be more effective, so that the hardness and the Young's modulus of the carbon layer 5 can be reduced. When the element ratio of hydrogen with respect to the carbon exceeds 20 atm %, the electron-emitting characteristic begins to deteriorate. Thus, an substantive upper limit is 20 atm %.

Figure 6:
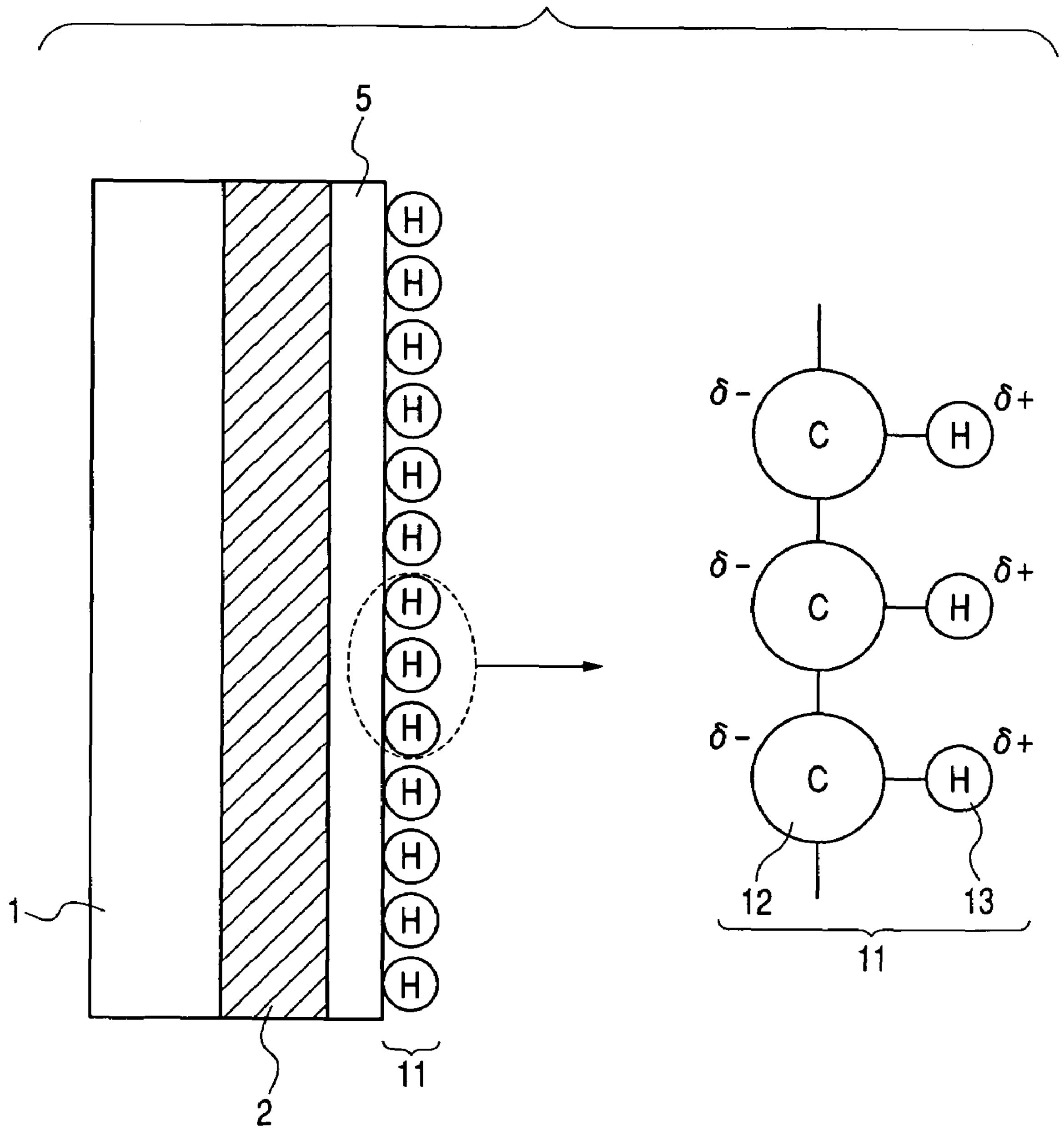
FIG. 6 is a schematic view showing a structure of a carbon layer having a dipole layer, which is used in the present invention.

As shown in FIG. 6, as another carbon layer which can be preferably applied in the present invention, there is one in which the carbon layer 5 is located on the surface of the cathode electrode 2, and a dipole layer 11 is formed on the surface of the carbon layer 5 (a dipole layer 11 is forming a part of the surface of the carbon layer 5). Even in the case of this configuration, the resistivity of the carbon layer 5 is preferably $1\times10$ Ωcm to $1\times10^{14}$ Ωcm, more preferably $1\times10^{7}$ Ωcm to $1\times10^{14}$ cm.

Here, the configuration example of the dipole layer 11 is described in which the surface of the carbon layer 5 (interface with a vacuum) is terminated with hydrogen. However, a material for forming the dipole layer 11 in the present invention is not limited to hydrogen. A material capable of reducing a surface level of the carbon layer 5 in a state in which a voltage is not applied between the cathode electrode 2 and the extraction electrode (gate electrode and/or anode electrode) may be used as the material terminating the surface of the carbon layer 5. In this invention, hydrogen is preferably used. In general, Hydrogen atoms 13 are slightly positively polarized (δ+). Therefore, atoms on the surface of the carbon layer 5 (carbon atoms 12 in this case) are slightly negatively polarized (δ−), so that the dipole layer (electric double layer) 11 is produced.

Figure 7A:
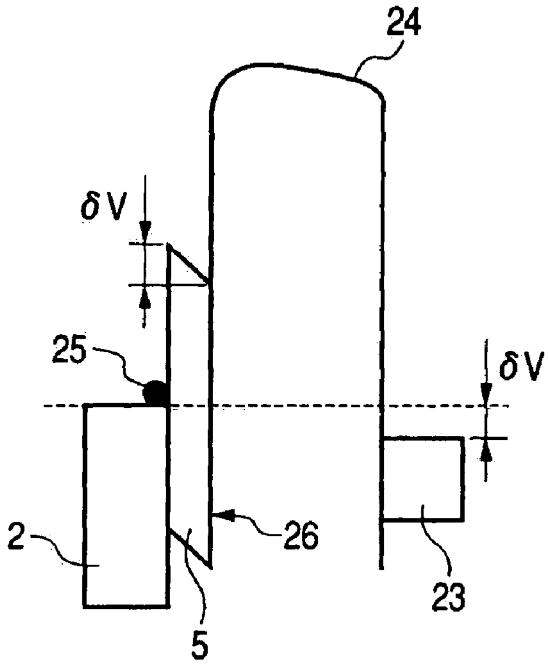
FIGS. 7A and 7B show an election emission principle in the carbon layer shown in FIG. 6.
Figure 7B:
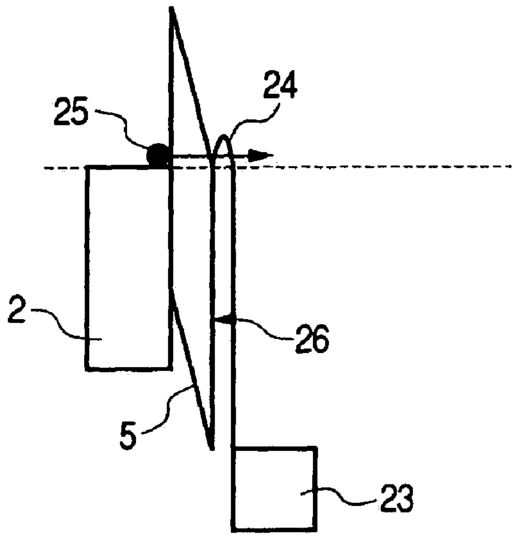

A priciple of an electron emission from the electron-emitting film having the dipole layer 11 will be described with reference to band diagrams shown FIGS. 7A and 7B. FIG. 7A shows the case where a voltage is not applied to an extraction electrode 23 and FIG. 7B shows the case where the voltage is applied to the extraction electrode 23. The extraction electrode 23 is the gate electrode, the anode electrode, or a combination of those. In FIGS. 7A and 7B, reference numeral 2 denotes the cathode electrode, 5 denotes the carbon layer, 23 denotes the extraction electrode, 24 denotes a vacuum barrier, 25 denotes an electron, and 26 denotes an interface between an insulating layer (the carbon layer) in which the dipole layer is formed on the surface thereon and a vacuum.

As shown in FIG. 7A, although a drive voltage is not applied between the cathode electrode 2 and the extraction electrode 23, a state equivalent to a state in which a potential δ [V] of the electric double layer is applied is obtained on the surface of the insulating layer by the dipole layer.

As shown in FIG. 7B, when the drive voltage V (V) is applied between the cathode electrode 2 and the extraction electrode 23, a potential drop of the carbon layer 5 progresses and the vacuum barrier 24 is lowered in conjunction with the potential drop. When the film thickness of the carbon layer 5 is set to a thickness (preferably 10 nm or less) of which tunneling (quantum-mechanical tunnelling) is possible according to the drive voltage V (V), a spatial distance that the electron 25 which is supplied from the cathode electrode 2 should pass through can be shortened. As a result, a state in which tunneling (quantum-mechanical tunnelling) is possible is obtained, thereby realizing the electron emission to a vacuum.

It is preferable that the material terminating the surface of the carbon layer 5 is practically a material for reducing the surface level of the carbon layer 5 by 0.5 eV or more, preferably 1 eV or more in a state in which the voltage is not applied between the cathode electrode 2 and the extraction electrode 23. Note that in the electron-emitting device of the present invention, it is required that the level of the surface of the carbon layer 5 indicates a positive electron affinity in each of the case where the drive voltage is applied between the cathode electrode 2 and the case where the drive voltage is not applied therebetween.

The film thickness of the carbon layer 5 can be determined according to the drive voltage. When the electron-emitting device is driven at several tens of V or less, the film thickness of the carbon layer 5 is set to 20 nm or less, more preferably 10 nm or less. The barrier (carbon layer 5 and vacuum barrier 24) through which the electron supplied from the cathode electrode 2 tunnels may be produced at the time of driving. In view of film reproducibility and the like, a lower limit of the film thickness of the carbon layer 5 is preferably set to 1 nm or more.

Therefore, when the surface of the carbon layer 5 always exhibits the positive electron affinity, a clear on/off ratio of an electron emission amount at each of the selection of an electron-emitting device and the non-selection thereof can be ensured. The electron-emitting device capable of ensuring the clear on/off ratio of the electron emission amount at each of the selection and the non-selection can be preferably applied to an electron source and an image display apparatus, in each of which it is necessary to emit electrons from an arbitrary electron-emitting device of a large number of electron-emitting devices.

The carbon layer 5 having the configuration shown in FIG. 6 may be further comprising arranged electroconductive particles 8 as described with reference to FIG. 2. That is, a configuration in which the dipole layer 11 shown in FIG. 6 is formed on the surface of the carbon layer 5 shown in FIG. 2 may be used in the electron-emitting device according to the present invention.

The carbon layer which can be preferably applied in the present invention is a layer capable of emitting electrons at an electric field lower than $1\times10^6$ V/cm. When the electric field lower than $1\times10^6$ V/cm is applied to the carbon layers shown in FIGS. 2 and 6, electrons can begin to emit. In other words, the electrons can be emitted by applying the electric field lower than $1\times10^6$ V/cm between the extraction electrode and the carbon layer.

Thus, the electron-emitting device of the present invention is different from the surface conduction electron-emitting device and the emission efficiency Ie/If is very high. Here, If indicates a current (device current) flowing between the cathode electrode and the extraction electrode and Ie indicates a current (emission current) flowing between the cathode electrode and the anode electrode. According to the electron-emitting device of the present invention, the interval between the gate electrode and the cathode electrode can be set to 1 μm or more. As a result, according to the electron-emitting device of the present invention, the emission efficiency of 30% or more can be realized and the emission efficiency of 60% or more can be also realized. In the case of the surface conduction electron-emitting device produced through a manufacturing process which is called "activation", the emission efficiency is several % and an interval between a gate electrode side carbon film and a cathode electrode side carbon film is several nm. From this point of view as well, it is found that the electron-emitting device of the present invention is not the surface conduction electron-emitting device.

Figure 8:
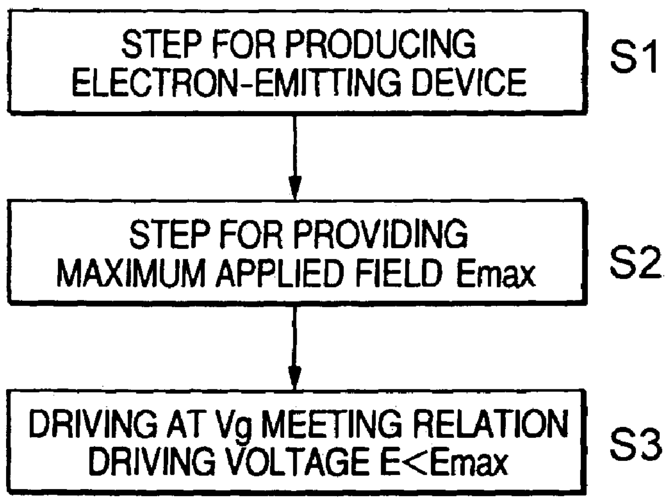
FIG. 8 is a flow chart showing a method of producing the electron-emitting device according to the present invention.

FIG. 8 shows an example of a manufacturing process of the present invention.

The manufacturing process of the present invention includes a step for producing an electron-emitting device (S1) and a characteristic adjusting step (S2). The characteristic adjusting step is a step for stabilizing an electron-emitting characteristic of a prepared electron-emitting device and/or uniformalizing the electron-emitting characteristic thereof, in which a step for providing a maximum applied field Emax to the carbon layer 5.

After the manufacturing process is completed, the applied field E provided to the carbon layer 5 of the electron-emitting device during a drive process all the time (S3) is preferably set smaller than Emax (S2).

Here, the applied field E provided to the carbon layer 5 will be described. The electric field applied to the electron-emitting film is determined based on a device structure, a drive state, and a drive voltage. In addition, the electric field is changed according to the position of the electron-emitting film. Hereinafter, an electron-emitting device having a triode structure will be mainly described.

The electric field applied to the carbon layer 5 is broadly divided into Ea resulting from the potential of the anode electrode and Eg resulting from the potential of the gate electrode. Here, assume that an anode voltage is represented by Va [V] (typically defined by a difference between the potential of the cathode electrode 2 and the potential of the anode electrode 4) and a distance between the cathode electrode 2 (or the carbon layer 5) and the anode electrode 4 is represented by H [μm]. An average electric field (Ea av [V/μm]) applied between the electron-emitting device and the anode electrode 4 can be defined: Ea av=Va/H [V/μm].

Assume that a voltage applied between the cathode electrode 2 and the gate electrode 3 is represented by Vg [V] and a distance between the cathode electrode 2 (or the carbon layer 5) and the gate electrode 3 is represented by W [μm]. An average electric field (Eg av [V/μm]) applied between the cathode electrode 2 and the gate electrode 3 can be defined: Eg av=Vg/W [V/μm].

Ea and Eg as described above are changed according to the structure of the electron-emitting device (electron-emitting film) and the position of the carbon layer, so that Ea=βa×Ea av and Eg=βg×Eg av. Here, βa and βg each indicates a field enhancement factor, which is a numerical value equal to or larger than 1. When the anode electrode 4 is located parallel to the electron-emitting device (particularly, the anode electrode 4 is located parallel to the electron-emitting film), βa is nearly equal to 1. βg significantly changes according to the structure of the electron-emitting device. When the electron-emitting member itself is tapered, there is the case where βg increases several-thousand-fold. When a relatively flat film is used as in the present invention, βg becomes smaller. However, βg enhances several-fold according to the structure.

In the case of the spindt type electron-emitting device or the surface conduction electron-emitting device, Eg av>>Ea av in general. The dominant electric field applied to the electron-emitting region (electric field for causing electron emission) is the electric field (Eg) produced by the voltage applied between the gate electrode 3 and the cathode electrode 2. The affect of Ea is little or very small.

βg is large at a portion of the carbon layer 5 which is nearest to the gate electrode 3. βg significantly reduces as a distance from the gate electrode 3 increases. Therefore, a location of the carbon layer 5 to which the maximum applied field Emax is provided, necessarily becomes a location in which βg is large.

On the other hand, in the case of the electron-emitting film in which a threshold electric field (electric field necessary to begin to emit electrons from the electron-emitting film) is low, such as the carbon layer 5 in the present invention, Eg at the time of driving can be reduced. Therefore, even if Ea is reduced, sufficient driving is possible. Note that, when Ea is reduced, there is a problem. For example, it is not necessarily effective that Ea is reduced (Va is reduced) in an image forming apparatus using a phosphor, in views of an efficiency of the phosphor and a life thereof.

Thus, when driving is performed using the electron-emitting film having a low threshold electric field as in the present invention, Eg av/Ea av may become 1 to several 10. In this case, the maximum applied field Emax provided to the electron-emitting member (electron-emitting film) is significantly affected by Ea.

Figure 14A:
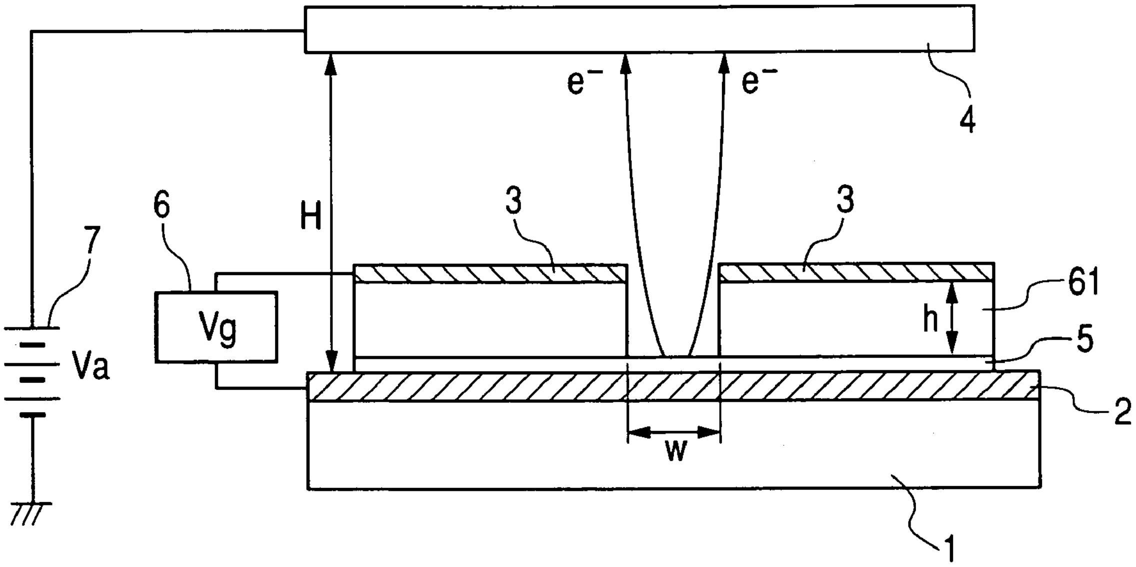
FIGS. 14A and 14B are schematic views showing another example of an electron-emitting device according to the present invention.
Figure 14B:
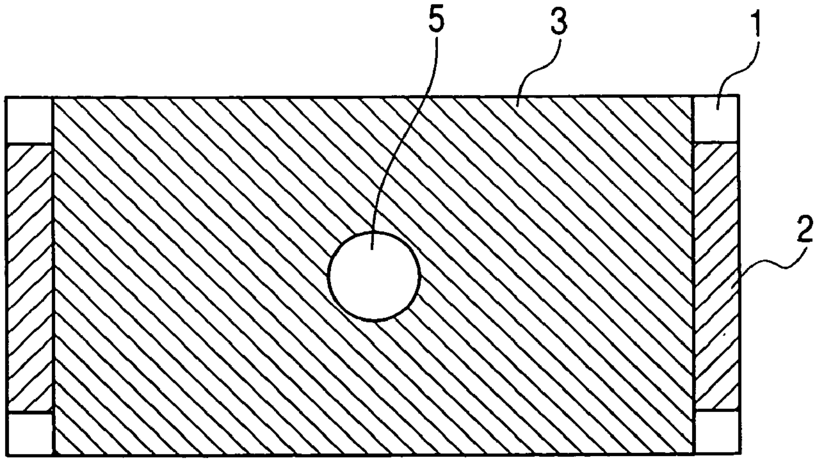

In particular, when the electron-emitting film of the present invention as shown in FIG. 1 or FIGS. 14A and 14B described later is located substantially parallel to the anode electrode 4 (and exposed), the affect of Ea becomes larger. In some cases, the electric field resulting from Ea is also applied to a portion of the electron-emitting film which is not near the gate electrode 3.

That is, in the case of the triode structure, the maximum applied field Emax in the present invention is provided by only the gate electrode 3, only the anode electrode 4, or a combination of those. As a natural result, in the case of the diode structure, the maximum applied field Emax in the present invention is provided by only the extraction electrode (anode electrode 4).

According to the present invention, in the case of the electron-emitting apparatus having the triode structure (that is, the electron-emitting apparatus which is composed of the anode electrode 4, the gate electrode 3, the cathode electrode 2, and the carbon layer 5), the gate electrode 3 and/or the anode electrode 4 can be called "the extraction electrode". In the case of the electron-emitting apparatus having the diode structure (that is, the electron-emitting apparatus which is composed of the anode electrode 4, the cathode electrode 2, and the carbon layer 5), the anode electrode 4 can be called "the extraction electrode".

FIGS. 9A to 9F show steps of manufacturing an electron-emitting device which is an example of the electron-emitting device having the configuration as shown in FIGS. 1A and 1B, which is preferable in the present invention.

(Step 1)

Figure 9A:
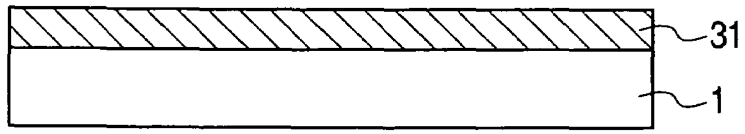
FIGS. 9A, 9B, 9C, 9D, 9E and 9F each show an example of a process for producing the electron-emitting device in the step order according to the present invention.

First, the substrate 1 whose surface is sufficiently washed in advance is used. The substrate 1 is selected from a quartz glass substrate, a glass substrate in which the amount of contained impurity such as Na is reduced, a soda lime glass substrate, a substrate composed of a stack in which an $SiO_2$ film is stacked on a substrate surface, and a ceramic insulating substrate and the like. An electroconductive film 31 (member for forming the cathode electrode 2 and the gate electrode 3) is stacked on the substrate 1 (FIG. 9A).

The electroconductive film 31 is formed by a general film deposition technique in vacuum such as an evaporation method or a sputtering method. For example, a material of the electroconductive film 31 is selected as appropriate from a metal such as Be, Mg, Ti, Zr, Hf, V, Nb, Ta, Mo, W, Al, Cu, Ni, Cr, Au, Pt, or Pd, and an alloy material, and the like. A thickness of the electroconductive film 31 is set in a range of 10 nm to several hundreds of μm, preferably, selected from a range of 100 nm to 90 μm.

(Step 2)

Figure 9B:
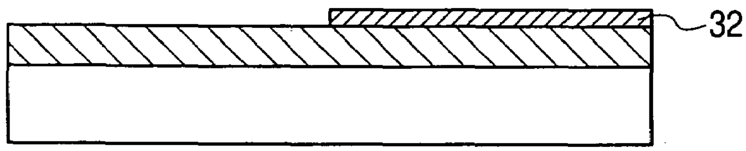

Next, as shown in FIG. 9B, a mask 32 is selectively formed on the electroconductive film 31. A photolithography method or the like is used as a method of forming the mask.

(Step 3)

Figure 9C:
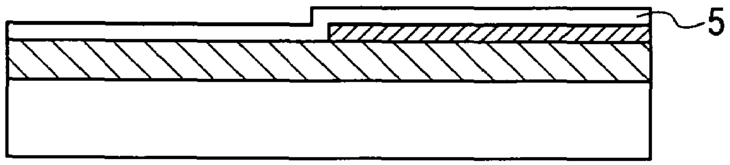

Then, the carbon layer 5 is formed (FIG. 9C). It is preferable that the carbon layer 5 has a high flatness. More specifically, a Root-Mean-Square surface roughness is preferably equal to or smaller than 1/10 of the average film thickness of the carbon layer 5. A Root-Mean-Square value is preferably 10 nm or less, more preferably 1 nm or less.

When the flatness is high, a field enhancement effect due to sharp formation is not caused. In general, the threshold electric field tends to increase. Therefore, the electron-emitting film in which an emission mechanism is devised, such as the carbon layer 5 described above in detail with reference to FIGS. 2 and 6 is effective.

The Root-Mean-Square indicates the square root of a value obtained by averaging the squares of deviations from an average line to a measurement curve. The Root-Mean-Square is also used in the JIS Standard.

Here, the surface roughness of the carbon layer 5 is the surface roughness in the case where it is stacked on a flat substrate (for example, Si substrate) not the surface roughness in the case where it is stacked on the electroconductive film 31. In other words, it exhibits the surface roughness of the carbon layer 5 itself, which is obtained by subtracting the surface roughness of the electroconductive film 31 serving as a base film. However, the surface roughness of the carbon layer on the electrode is effective to suppress the spread of the electron beam. Therefore, it is effective that the Root-Mean-Square surface roughness of the carbon layer on the electrode (in state in which the surface roughness of the carbon layer is added to the surface roughness of the electrode) is within the above-mentioned range.

Figure 9D:
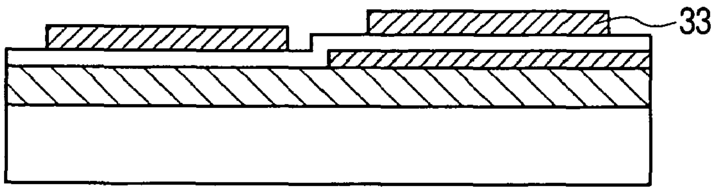

(Step 4),

In order to separate the cathode electrode 2 from the gate electrode 3 by a photolithography method, patterning is performed using a photo resist mask 33 (FIG. 9D).

(Step 5)

Figure 9E:
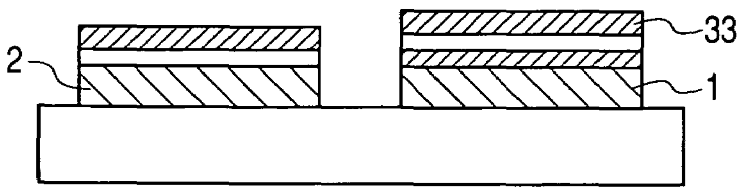

Next, etching processing is performed to separate the cathode electrode 2 from the gate electrode 3 (FIG. 9E). A smooth etching surface is desirably obtained by a step for etching the electroconductive film 31 and the carbon layer 5. An etching method may be selected according to the materials of the electroconductive film 31 and the carbon layer 5, which may be dry etching or wet etching.

(Step 6)

Figure 9F:
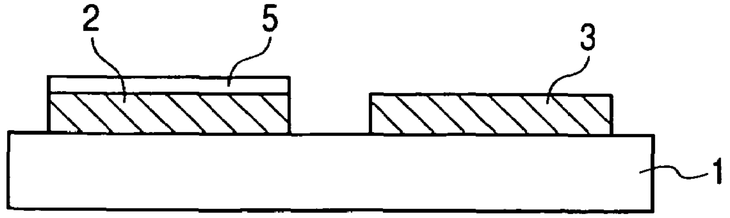

The masks 32 and 33 are removed, so that an electron-emitting device having a configuration shown in FIG. 9F (configuration shown in FIG. 1A) can be produced.

In general, the distance w between the cathode electrode 2 and the gate electrode 3 (see FIGS. 1A and 1B) is set as appropriate according to materials composing the electron-emitting device, resistance values thereof, an electrical characteristic of the carbon layer 5, a necessary shape of an electron emission beam and the like. The distance w is generally 100 nm or more, preferably 1 μm or more. The distance w is preferably set to 100 μm or less.

Finally, a step for making electrons easily emit can be also added by various post-processings. Example of the post-processings are anneal processing, plasma processing, and the like. In particular, such post-processings are preferably performed in the case where the surface termination (formation of the dipole layer) as shown in FIG. 6 is produced.

(Step 7)

Next, the characteristic adjusting step which is the feature of the present invention is performed.

As described above, the characteristic adjusting step is the step for stabilizing the electron-emitting characteristic and/or uniformalizing the electron-emitting characteristic. This results from that the characteristic adjusting step in the present invention is a step for changing an I-V characteristic (current-voltage characteristic) of the electron-emitting device (electron-emitting apparatus) obtained through the manufacturing process, to a desirable I-V characteristic.

The characteristic adjusting step can be rephrased as the step for providing the maximum applied field Emax to the carbon layer 5. Here, "the maximum applied field" represents an electric field higher than the electric field applied to the carbon layer 5 before the characteristic adjusting step is performed. The present invention is not predicated on that the electric field is applied before the characteristic adjusting step. The characteristic adjusting step of the present invention involves the electron emission from the carbon layer 5.

When the maximum applied field Emax is provided to the carbon layer 5, the maximum applied field Emax is not provided from the beginning but the electric field applied to the carbon layer 5 is gradually increased to reach the maximum applied field Emax. This is preferable to perform the stable characteristic adjusting step.

It can be assumed that the step for providing the maximum applied field Emax as described above is equivalent to that a value of a current emitted from the carbon layer 5 is maximized. In this viewpoint, the characteristic adjusting step of the present invention can be also rephrased as a step for causing the carbon layer 5 to emit a maximum current Imax. It is preferable to perform the characteristic adjusting step of the present invention by gradually increasing the value of the current emitted from the carbon layer 5.

For example, in the case where an electron-emitting apparatus to which the electron-emitting device is applied has the triode structure (including three electrodes, that is, the anode electrode, the cathode electrode, and the gate electrode), it is preferable to perform the characteristic adjusting step in the same relative arrangement as the relative arrangement among the three electrodes at a time when the electron-emitting apparatus is actually driven. This is similarly performed in the case of an electron-emitting apparatus having the diode structure and in the case of an electron-emitting apparatus having a quatrode structure. When the characteristic adjusting step of the present invention is applied to the electron-emitting device of the electron-emitting apparatus (for example, a flat panel display), it is preferable to perform the characteristic adjusting step after seal-bonding of a panel in which a face plate including the anode electrode 4 is generally opposed to a rear plate including the electron-emitting device, which is used in the flat panel display. Of course, the characteristic adjusting step may be performed before the seal-bonding of the panel. The anode electrode 4 for the characteristic adjusting step is located at a distance equal to a distance between the anode electrode 4 in an actual panel and the rear plate and then the characteristic adjusting step is performed. After that, the seal-bonding is performed on the face plate including the anode electrode 4 for a panel and the rear plate including the electron-emitting device obtained through the characteristic adjusting step, so that the panel can be produced.

When the characteristic adjusting step is performed in such a relative arrangement relationship, it can be assumed that the step for providing the maximum applied field Emax is effectively a step for applying a maximum voltage Vmax between the cathode electrode 2 and the extraction electrode in order to make electrons emit from the electron-emitting film. The maximum voltage Vmax is most preferable because the easiest characteristic adjusting step can be performed. Even when the maximum voltage Vmax is applied between the cathode electrode 2 and the extraction electrode, it is preferable to gradually increase a voltage applied therebetween.

The example in which the characteristic adjusting step is performed in the same relative positions as the relative positions of the respective electrodes composing the electron-emitting apparatus is described. The present invention is not limited to the above-mentioned relative positions. That is, for example, in consideration for the relative positions of the respective electrodes composing the electron-emitting apparatus, an electric field intensity higher than the electric field intensity applied to the carbon layer 5 of the electron-emitting device at a time when the electron-emitting apparatus is actually driven may be applied to the carbon layer 5. Therefore, when the characteristic adjusting step is performed before the seal-bonding step of the panel, the application of Emax can be also realized by, for example, increasing the voltage of the anode electrode 4 instead of distancing the anode electrode 4 from the rear plate with respect to the position of the anode electrode 4 after the seal-bonding step.

Next, "the characteristic adjusting step" which is the feature of the present invention will be specifically described with reference to FIGS. 10A to 10C and 11.

Figure 10A:
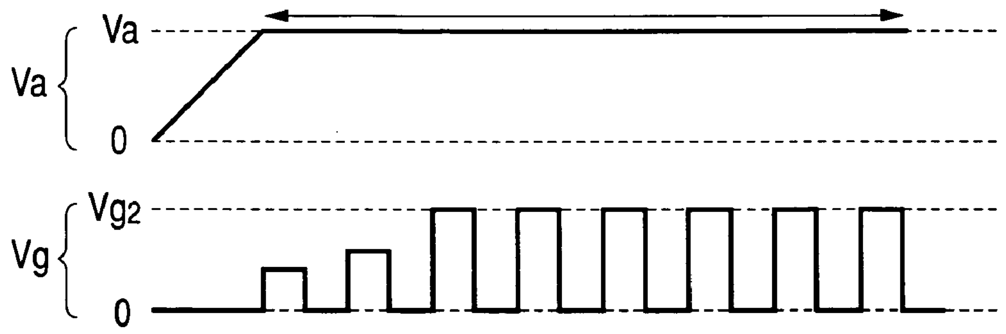
FIGS. 10A, 10B, and 10C are explanatory views showing applied voltages in a characteristic adjusting step of the present invention.

FIG. 10A shows an example of the characteristic adjusting step of the present invention in the case where the maximum applied voltage Vmax is provided to the carbon layer 5 (period indicated by arrows in FIG. 10A).

Figure 10B:
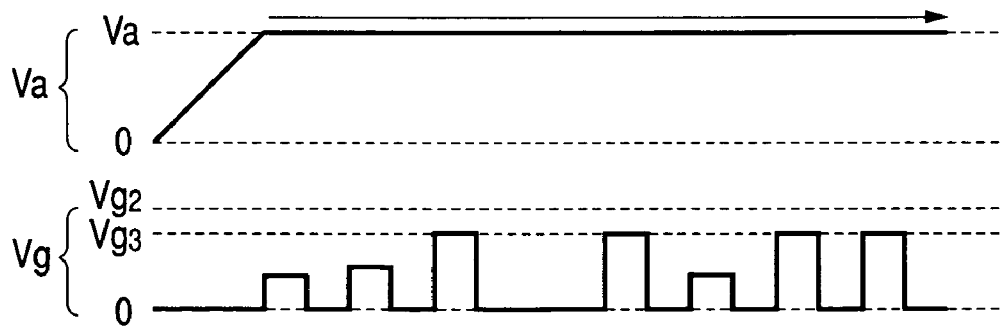
Figure 10C:
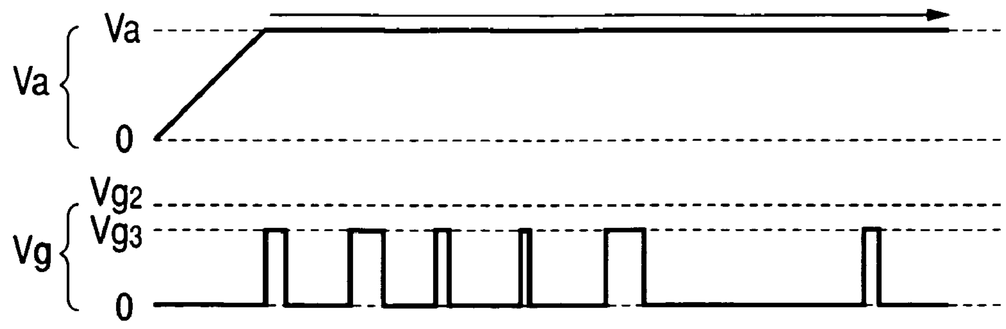

FIGS. 10B and 10C each show an example of a method of driving an electron-emitting device (period indicated by an arrow in each of FIG. 10B and 10C) after the characteristic adjusting step shown in FIG. 10A is completed, in which both Va and Vg are applied to provide the maximum applied voltage.

FIG. 10A shows an example in which the characteristic adjusting step is performed by gradually increasing a peak value of a pulse voltage Vg [V] applied between the cathode electrode 2 and the gate electrode 3 to Vg2 in a state in which a constant anode voltage Va [V] is provided to the anode electrode 4.

FIG. 10B shows an example in which the electron-emitting device after the completion of the characteristic adjusting step is driven by voltage modulation, which is an example in which Vg3 is set as a maximum voltage such that the peak values of the pulse voltages Vg applied between the cathode electrode 2 and the gate electrode 3 to Vg2 satisfy Vg3<Vg2 in a state in which the constant anode voltage Va is provided to the anode electrode 4.

FIG. 10C shows an example in which the electron-emitting device is driven by pulse width modulation. The constant anode voltage Va is provided to the anode electrode 4 and a drive voltage is Vg3 (<Vg2).

In FIGS. 10B and 10C, when the electron-emitting device is driven, only an electric field smaller than the maximum applied field Emax is provided to the carbon layer 5.

Even in any process, Vg represents the pulse voltage. The present invention is not limited to the pulse voltage and a DC (direct current) voltage may be used. The characteristic adjusting step can be performed by repeatedly applying a constant voltage pulse. It is preferable to repeatedly apply a gradually increased voltage.

On the other hand, when the electron-emitting device after the completion of the characteristic adjusting step is driven by applying the pulse voltage, it is desirable to set a short pulse width or a small duty ratio (pulse width/pulse period) based on a pulse condition used in the step for providing Emax. A period required for the characteristic adjusting step changes within a range of several msec. to several minutes according to a kind of the carbon layer 5. Therefore, the period is determined as appropriate.

Figure 11:
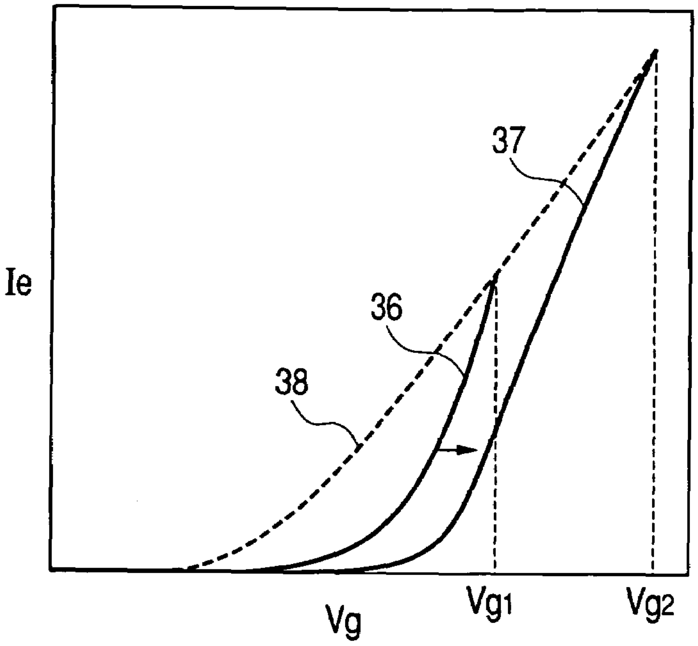
FIG. 11 is a graph showing an electrical characteristic of the electron-emitting device obtained through the characteristic adjusting step of the present invention.

FIG. 11 is a graph showing an electrical characteristic of the electron-emitting device obtained through the characteristic adjusting step of the present invention, which shows a change in characteristic of the emission current Ie to the voltages Vg applied between the cathode electrode 2 and the gate electrode 3 in a state in which the anode voltage Va is applied in the step for providing the maximum applied voltage Emax.

In FIG. 11, a solid line 36 exhibits an electrical characteristic in the case where the voltage applied between the cathode electrode 2 and the gate electrode 3 is increased to Vg1, temporarily reduced to 0 [V], and then increased again to Vg1. A solid line 37 exhibits an electrical characteristic in the case where the drive voltage is increased to Vg2, temporarily reduced to 0 [V], and then increased again to Vg2. A threshold electric field required for electron emission in the solid line 37 becomes higher than that in the solid line 36 and the amounts of Ie are different from each other. Note that a broken line 38 exhibited by plotting the emission current values to the applied voltages in the case where the voltage is increased from 0 [V] to Vg2 without being temporarily reduced.

In FIG. 11, a line of an electrical characteristic at up to Vg2 in the case where Vg2 is temporarily applied, the voltage is reduced to 0 [V] (the characteristic adjusting step is completed), and then the drive voltage is increased to Vg2 becomes substantially the same curve as the solid line 37. After that, even when the voltage is changed from 0 [V] to Vg2, the electrical characteristic does not substantially change.

In the present invention, when the characteristic adjusting step is performed, the electrical characteristic of the electron-emitting device is stabilized. It is estimated that an increase in threshold electric field results from that an unstable emission cite which exists immediately after the manufacturing step and may emit electrons at a low electric field is lost by the characteristic adjusting step, thereby stabilizing the emission current. With respect to support of this, when an emission cite is observed during the measurement of the electrical characteristic, an emission cite image in the solid line 36 is different from that in the solid line 37. After the step based on the solid line 37 is preformed, the emission cite image does not change.

As described above, when the maximum applied field Emax is applied before driving, the electron-emitting characteristic of the carbon layer 5 can be stabilized to fix the electrical characteristic. An important point in the present invention is that, after the characteristic adjusting step is performed, the electron-emitting device is driven (to emit electrons) so as not to exceed a maximum value of the emission current in the characteristic adjusting step (effectively, a maximum field applied to emit electrons in the characteristic adjusting step or a maximum voltage applied to emit electrons in the characteristic adjusting step). According to such driving, the I-V characteristic obtained through the characteristic adjusting step can be maintained. Here, "maintaining of the I-V characteristic obtained through the characteristic adjusting step" is not a sense that the deterioration of time on the I-V characteristic of the electron-emitting device is not caused.

Next, application examples of the electron-emitting device to which the present invention is applied will be described below. When a plurality of electron-emitting devices according to the present invention are arranged on a base (substrate), an electron-emitting apparatus such as an electron source or an image display apparatus can be produced.

Various arrangements can be employed for the electron-emitting devices. As an example, there is a so-called "matrix arrangement". According to the matrix arrangement, a plurality of electron-emitting devices arranged in a row-and-column shape in the X-direction and the Y-direction. One of the cathode electrode 2 and the gate electrode 3 composing each of a plurality of electron-emitting devices arranged in the same row is commonly connected with an X-directional wiring. The other of the cathode electrode 2 and the gate electrode 3 composing each of a plurality of electron-emitting devices arranged in the same column is commonly connected with a Y-directional wiring.

Figure 12:
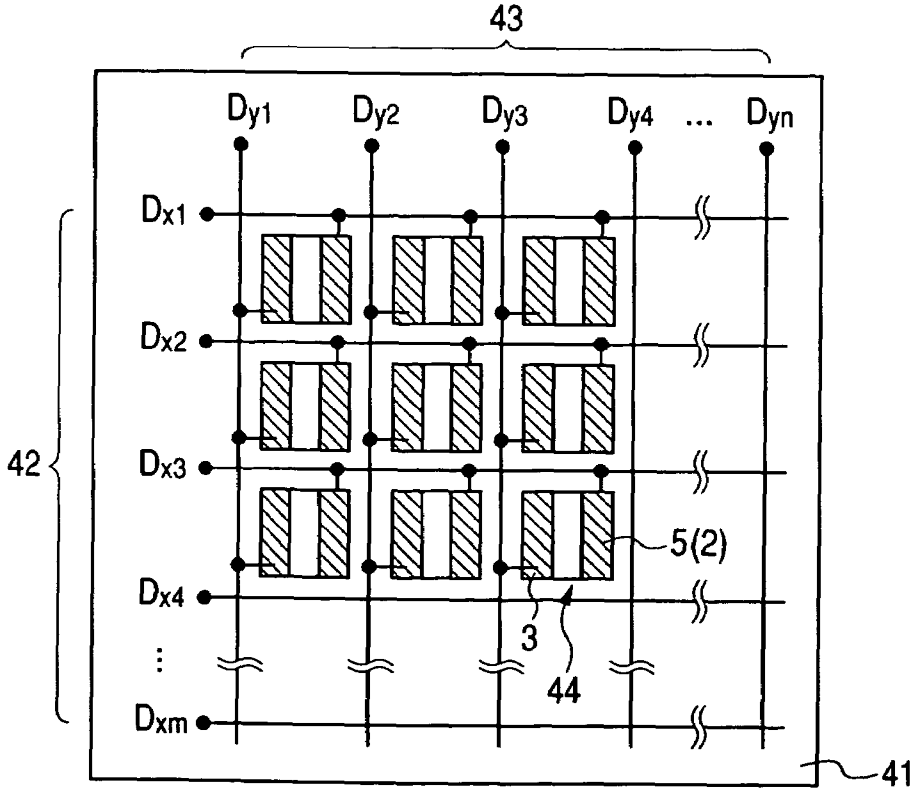
FIG. 12 is a schematic plan view showing an example of an electron source using the electron-emitting device according to the present invention.

Hereinafter, an electron source having the matrix arrangement obtained by arranging the plurality of electron-emitting devices to which the present invention can be applied will be described with reference to FIG. 12. In FIG. 12, the electron source includes an electron source base (substrate) 41, X-directional wirings 42, Y-directional wirings 43, and electron-emitting devices 44 according to the present invention.

The m X-directional wirings 42 include Dx1, Dx2, . . . , Dxm and can be made from metal films which are formed by a vacuum deposition method, a printing method, a sputtering method, or the like. A material of the wirings, a film thickness thereof, and a width thereof are designed as appropriate. The Y-directional wirings 43 include n wirings Dy1, Dy2, . . . , Dyn and formed as in the case of the X-directional wirings 42. An interlayer insulating film which is not shown is provided between the m X-directional wirings 42 and the n Y-directional wirings 43 and electrically insulates therebetween. Here, m and n each are a positive integer.

The interlayer insulating film which is not shown is made from an $SiO_2$ film or the like which is formed by a vacuum deposition method, a printing method, a sputtering method, or the like. For example, the interlayer insulating film is formed in a desirable shape on the entire surface or a portion of the base (substarate) 41 on which the X-directional wirings 42 are formed. In particular, a film thickness of the interlayer insulating film, a material thereof, and a manufacturing method thereof are set as appropriate such that the interlayer insulating film can resist potentials at intersections between the X-directional wirings 42 and the Y-directional wirings 43. The X-directional wirings 42 and the Y-directional wirings 43 are led as external terminals.

The cathode electrode 2 and the gate electrode 3 which compose each of the electron-emitting devices 44 are electrically connected with one of the m X-directional wirings 42 and one of the n Y-directional wirings 43.

With respect to a material composing the X-directional wirings 42 and the Y-directional wirings 43, and a material composing the cathode electrodes and the gate electrodes, a part or all of these constitutional elements may be identical or different from one another. When the material composing the cathode electrodes 2 and the gate electrodes 3 is identical to the wiring material, the X-directional wiring 42 and the Y-directional wiring 43 can be collectively called a cathode electrode wiring and a gate electrode wiring, respectively.

The X-directional wirings 42 are connected with a scanning signal applying unit (not shown) that applies a scanning signal for selecting a row of the electron-emitting devices 44 arranged in the X-direction. On the other hand, the Y-directional wirings 43 are connected with a modulation signal generating unit (not shown) that modulates a signal for each column of the electron-emitting devices 44 arranged in the Y-direction according to an input signal. A drive voltage applied to each of the electron-emitting devices 44 is supplied as a differential voltage between the scanning signal and a modulation signal which are applied to the corresponding electron-emitting device. Here, the example in which the scanning signal is applied to the cathode electrode 2 and the modulation signal is applied to the gate electrode 3 is described. A configuration in which the modulation signal is applied to the cathode electrode 2 and the scanning signal is applied to the gate electrode 3 may be used.

Figure 13:
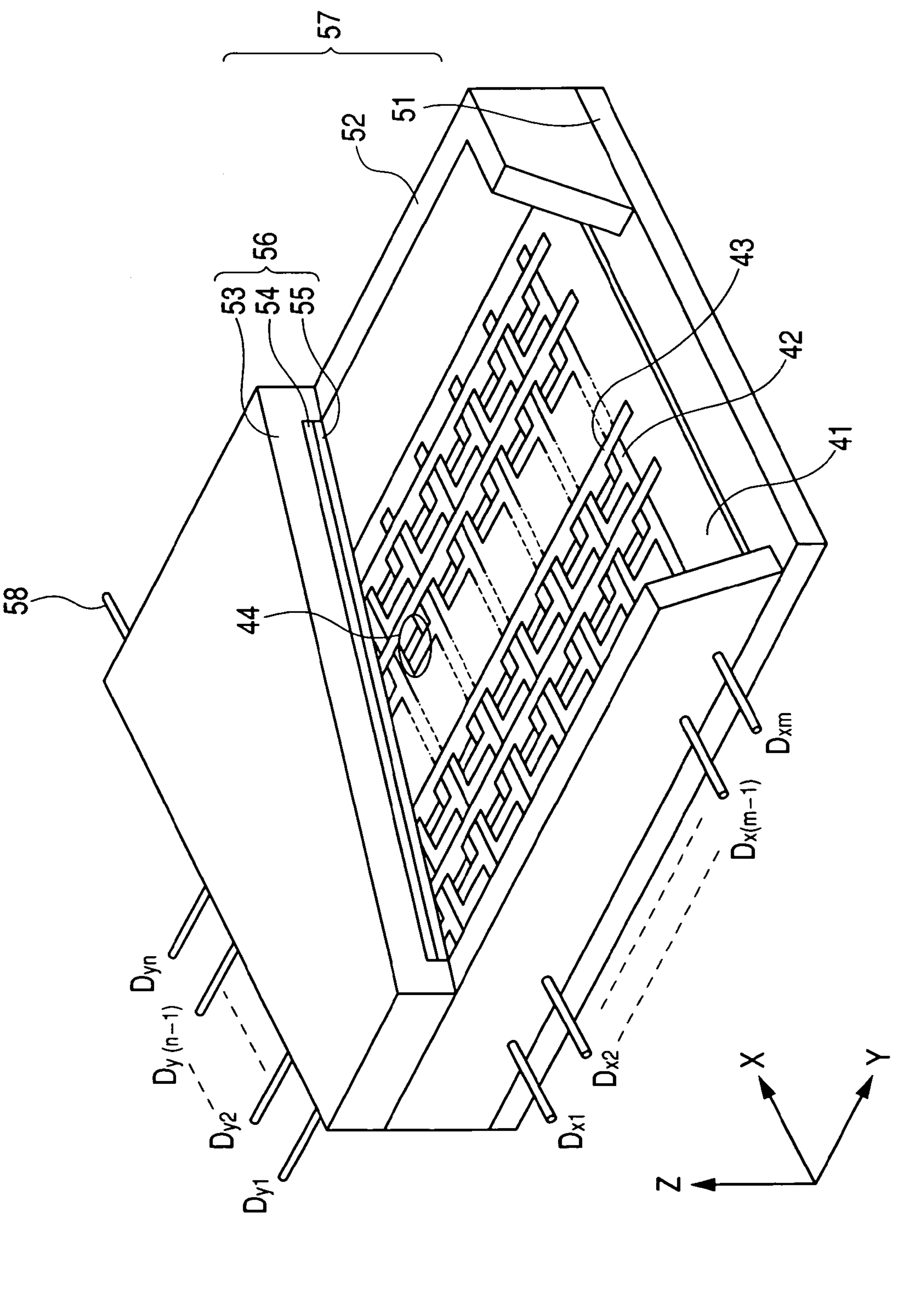
FIG. 13 is a perspective view showing an example of an image display apparatus using the electron-emitting device according to the present invention.

In the above-mentioned structure, the electron-emitting devices can be individually selected and independently driven. An image display apparatus using the electron source having the above-mentioned structure will be described with reference to FIGS. 13. FIG. 13 is a schematic view showing an example of a display panel of the image display apparatus according to the present invention.

In FIG. 13, reference numeral 41 denotes an electron source base on which a plurality of electron-emitting devices are arranged. Reference numeral 51 denotes a rear plate onto which the electron source base 41 is fixed. Reference numeral 56 denotes a face plate in which a phosphor film 54 that is a phosphor as an image-forming member, a metal back 55 as an anode are formed on the inner surface of a glass base (substrate) 53. Reference numeral 52 denotes a support frame. The support frame 52 is bonded to the rear plate 51 and the face plate 56 using a bonding material such as a frit glass or the like. Reference numeral 57 denotes an envelope. The envelope 57 is baked for seal-bonding of the rear plate 51, the face plate 56 and the support frame 52, for example, in an atmosphere or a nitrogen atmosphere at a temperature of 400° C. to 500° C. for 10 minutes or longer.

As described above, the envelope 57 is composed of the face plate 56, the support frame 52, and the rear plate 51. The rear plate 51 is provided to reinforce mainly the strength of the base 41. Therefore, when the base 41 itself has a sufficient strength, a separate rear plate 51 can be omitted. In other words, the support frame 52 may be directly bonded for sealing to the base 41 to obtain the envelope 57 composed of the face plate 56, the support frame 52, and the base 41. On the other hand, when another support members (not shown) which are called spacers are provided between the face plate 56 and the rear plate 51, the envelope 57 which has a sufficient strength to an atmospheric pressure can be constructed.

The envelope (panel) obtained through the sealing bonding step is sealed. An example of the seal step is performed as follows. While the envelope (panel) 57 is heated, the inner portion of the envelope is evacuated through an evacuation pipe (not shown) by an evacuation apparatus. After the evacuation of the inner portion of the envelope, the evacuation pipe is sealed up. In order to maintain a pressure in the sealed envelope 57, getter processing can be performed. As a getter material, an evaporation type such as Ba or a non-evaporation type can be used. Here, the method of sealing the evacuation pipe after the seal-bonding is described. When the seal-bonding step is performed in a vacuum chamber, it is not necessary to provide the seal step after the seal-bonding step.

According to the image display apparatus using the electron source having the matrix arrangement, which is manufactured by the above-mentioned steps, when voltages generated by circuits that generate drive signals are applied to the respective electron-emitting devices through external terminals Dx1 to Dxm and Dy1 to Dyn, electrons can be emitted from desirable electron-emitting devices. A high voltage Va is applied to the metal back 55 through a high voltage terminal 58 to accelerate the emitted electrons. The accelerated electrons collide with the phosphor film 54 to cause light emission, thereby forming an image.

The image display apparatus according to the present invention can be used as a display apparatus for television broadcast, a display apparatus for a television conference system, a computer, or the like, an image display apparatus serving as an optical printer constructed using a photosensitive drum, etc.

And, an apparatus for receiving a broadcast distribution signal of television broadcasting, a satellite broadcasting or a character broadcasting to display and reproduce an information contained in the signal comprises, in concrete, a receiver for receiving the signal and a tuner for tuning the signal received, wherein at least one of an image information, a character information and a sound signal is outputted to the envelope 57 (an image display apparatus) according to the present invention thereby displaying and/or reproducing the information. By means of such structure, the apparatus for reproducibly displaying the information such as television can be formed. Of course, in case of encoding the broadcasting signal, the apparatus displaying and reproducing the information according to the present invention may include a decoder. And, the sound signal may be outputted to sound reproducing means such as a speaker, and is reproduced synchronously with the image information and the character information displayed by the envelope (image display apparatus) 57.

And, as a method of displaying and/or reproducing the image information or the character information by outputting it to the envelope (image display apparatus) 57, for example, following process may be performed. For example, from the image information and the character information received, the image signal corresponding to respective pixels of the envelope (image display apparatus) 57 may be produced. And, the image signal produced is inputted into a drive circuit of the envelope (image display apparatus) 57. And, based on the image signal inputted into the drive circuit, a voltage applied to respective electron-emitting devices in the envelope (image display apparatus) 57 is controlled to display the image.

Even in the image display apparatus of the present invention, when the characteristic adjusting step is performed before actual driving, the electrical characteristic can be adjusted to a desirable characteristic. With respect to the characteristic adjusting step, after an electron source substrate is produced, the electric field is applied through the electron source substrate and an anode substrate used only for characteristic adjusting step. The characteristic adjusting step may be performed after the above-described seal-bonding step of the envelope (panel). However, the characteristic adjusting step is preferably performed after the seal-bonding step.

When the characteristic adjusting step is performed on a desirable electron-emitting device, a deviation in I-V characteristics of the individual electron-emitting devices, which is caused in a manufacturing step of the electron source, the envelope 57, or the like can be reduced.

That is, in the characteristic adjusting step, the characteristics of the individual electron-emitting devices are changed such that Ie (emission current) and/or If (current flowing between the cathode electrode and the gate electrode) in the individual electron-emitting devices become substantially equal to one another in a range of a voltage applied in driving. According to such a method, the individual electron-emitting characteristics can be uniformalized. Even when a variation is caused in manufacturing, the uniformity of a display image on a display or the like can be improved.

For example, the same voltage is applied to all electron-emitting devices once. Then, a difference among the characteristics of a plurality of electron-emitting devices is reduced based on the emission current value and/or the device current value which are/is measured at this time. For example, the characteristics of electron-emitting devices can be changed so as to approach the characteristic of the electron-emitting device having a worst value of the measured values. When the measured values can be allowed, the electron-emitting characteristics are not necessarily adjusted as a matter of course.

Hereinafter, examples of the present invention will be described in detail.

EXAMPLE 1

An electron-emitting device is manufactured according to the steps shown in FIGS. 9A to 9F and 10A to 10C.

(Step 1)

First, the substrate 1 made of quartz glass is used and sufficiently washed, and then a TiN film having a thickness of 700 nm is formed thereon as the electroconductive layer 31 which becomes the cathode electrode 2 and the gate electrode 3 by a sputtering method (FIG. 9A).

(Step 2)

An SiOx film is stacked with a thickness of 0.08 μm by a sputtering method and an SiOx mask 32 is formed through a resist mask using a photolithography method (FIG. 9B).

(Step 3)

Then, an amorphous carbon layer is deposited as the carbon layer 5 at a film thickness of 100 nm by a hot filament CVD (HF-CVD) method (FIG. 9C). Conditions of the HF-CVD method are as follows. The film thickness is adjusted based on a film formation time.

Filament: tungsten

Filament temperature: 1800° C.

Substrate temperature: room temperature

Gas: methane

Gas pressure: 0.1 Pa

Distance between substrate and filament: 50 mm

Substrate bias: 350 V (voltage is applied to electroconductive film 31)

The substrate is irradiated with electrons from the filament, so that an electrode surface is activated even at room temperature. Therefore, a condition in which a gas can be decomposed to deposit the amorphous carbon layer is obtained. According to a TEM observation, the deposited amorphous carbon layer was a film partially having an incomplete graphite structure. A minute unevenness exits in the surface of the film and the Root-Mean-Square surface roughness was 6 nm (which is measured in the case where only the film is deposited on an $n^+$-Si substrate).

(Step 4)

The resist mask 33 is formed at a film thickness of 1 μm using a photolithography method (FIG. 9D). The distance w is set to 1 μm.

(Step 5)

Next, the amorphous carbon layer and the TiN electrode (film) are successively dry-etched. In order to completely etch the TiN electrode, a condition for slightly etching the quarts glass substrate is selected (FIG. 9E).

(Step 6)

Next, the resist mask 33 is removed using a peeling solution and then the $SiO_2$ mask 32 and the amorphous carbon layer formed thereon are removed by a lift-off method. Even in this case, an exposed portion of the quarts glass substrate having substantially the same composition is slightly etched to remove the SiOx film (FIG. 9F).

The electron-emitting device having such a structure is placed in a vacuum chamber. At this time, a phosphor is located on an ITO electrode as the anode electrode 4 is used. The distance H is set to 1 mm.

Then, Va and Vg are applied in the step shown in FIG. 10A so as to apply the maximum applied field to the device. Va is set to 5 [kV]. With respect to the pulse voltage Vg, a pulse width is set to 1 msec., a repetition frequency is set to 500 Hz, a duty ratio is set to 50%, and Vg2 is set to 60 V. Therefore, the threshold value required for electron emission was originally 28 V and then increased to 30 V.

The pulse width modulation driving shown in FIG. 10C is performed with the same arrangement in the vacuum chamber. According to this step, the luminance of the phosphor disposed on the anode electrode 4 is obtained according to the pulse width.

The step is performed on the same electron-emitting device. The applied voltage Va to the anode electrode 4 is set to 0 kV. With respect to the pulse voltage Vg, the pulse width is set to 1 msec., the repetition frequency is set to 500 Hz, the duty ratio is set to 50%, and Vg2 is set to 60 V.

Even in this case, the threshold value required for electron emission was originally 28 V and then increased to 30 V.

Because Ea av=5000 V/1 mm (=5 V/μm), Eg av=30 V/2 μm (=15 V/μm), and the gate electrode 2 and the anode electrode 4 are located in parallel, the structure of this example is a structure easily influenced by Ea on the upper surface of the film. Therefore, in a preferred structure, both Va and Vg are applied to provide the maximum field.

Even when Va is not applied, the electrical characteristic is substantially similarly stabilized. This results from the device structure and a property of the electron-emitting film.

The electric field required at driving the carbon layer in this example was 50 V/μm. In the structure of this example, the highest electric field is applied to a region near the gate electrode 3, βg exceeds about 6, and Eg exceeds 90 V/μm. Therefore, the emission site is limited to the near region. Thus, in this example, it is concluded that even when only Vg is applied, the electrical characteristic is stabilized.

According to the electron-emitting device produced in this example, the stable electron-emitting characteristic can be obtained for a long period.

EXAMPLE 2

Next, an electron-emitting device including the carbon layer 5 with the dipole layer 11 as shown in FIG. 6 is produced. The electron-emitting device of this example is a device that emits electrons at a lower electric field.

(Step 1) and (Step 2)

The steps are the same as those in Example 1 except that the film thickness of the TiN film is set to 100 nm.

(Step 3)

The carbon layer 5 is deposited at a film thickness of about 4 nm by a sputtering method. Graphite is used as a target and the film formation is performed in an argon atmosphere. A resistivity of the carbon layer 5 is $1\times10^{11}$ Ω·cm.

(Step 4) to (Step 6)

The same steps as in Example 1 are performed.

(Step 7)

Then, the carbon layer 5 is subjected to heat treatment in a heat treatment furnace in a mixture gas atmosphere containing methane and hydrogen based on the following conditions.

Heat treatment temperature: 600° C.

Heating method: lamp heating

Treatment time: 60 minutes

Mixture gas ratio: methane/hydrogen=15/6

Pressure at heat treatment: 6 kPa.

The dipole layer 11 is formed on the surface of the carbon layer 5 in this step. In this state, the surface of the carbon layer 5 is very flat and the Root-Mean-Square surface roughness was 0.2 nm (which is measured in the case where only the film is deposited on an Si substrate and heat treatment is performed).

The electron-emitting device having such a structure is placed in the vacuum chamber. As in Example 1, the anode electrode 4 in which the phosphor is located on the ITO electrode is used. The distance H is set to 2 mm.

Then, the maximum applied voltage is provided to the electron-emitting device in the step shown in FIG. 10A. Va is set to 10 kV. With respect to the pulse voltage Vg, the pulse width is set to 1 msec., the repetition frequency is set to 500 Hz, the duty ratio is set to 50%, and Vg2 is set to 25 V.

Therefore, the threshold value required for electron emission was originally 8 V and then increased to 12 V.

The pulse width modulation driving shown in FIG. 10C is performed with the same arrangement in the vacuum chamber. At this time, Vg3 is set to 20 V. According to this step, the luminance of the phosphor which is the anode electrode 4 is obtained according to the pulse width.

The electron-emitting device becomes a device which has a high flatness and emits electrons at a low threshold electric field. The electric field required at driving the carbon layer 5 (at emitting electrons) in this example was 15 V/μm.

Even in this example, as in Example 1, the case where both Va and Vg are applied and the case where only Vg is applied are adopted in the step for providing the maximum applied field. It is optimum to apply both Va and Vg because of a small variation.

Because Ea av=10000 V/2 mm (=5 V/μm), Eg av=25 V/2 μm (=12.5 V/μm), the structure of this example is the same structure as in Example 1 and Ea av is the same as in Example 1. Therefore, it is easily influenced by Ea on the upper surface of the film.

Because the device structure is also the same as in Example 1, the highest electric field is applied to the region near the gate electrode 3. When the drive voltage reduces, βg becomes about 3, and Eg becomes about 40 V/μm. At this time, an electric field that electrons can be emitted from the film is obtained over a given area even on the upper surface of the film.

Thus, in this example, when only Vg is applied, the stabilization of the electrical characteristic may be insufficient. The maximum applied field is provided to the same region as in driving by applying Va, so that the electrical characteristic can be stabilized.

According to the electron-emitting device produced in this example, although the electron emission is possible at a low electric field, the stable electron-emitting characteristic can be obtained for a long period.

EXAMPLE 3

An electron-emitting device having a structure schematically shown in FIGS. 14A and 14B is manufactured.

(Step 1)

First, the substrate 1 made of quartz glass is used and sufficiently washed, and then a Ta film having a thickness of 500 nm is formed thereon as the cathode electrode 2 by a sputtering method.

(Step 2)

Next, a DLC film is deposited as a base of the carbon layer 5 at about 30 nm by an HFCVD method. The DLC film is-a film having a high resistivity of $1\times10^{12}$ Ω·cm. A growth condition is as follows.

Gas: $CH_4$
Substrate bias: −50 V
Gas pressure: 267 mPa
Substrate temperature: room temperature
Filament: tungsten
Filament temperature: 2100° C.

(Step 3)

Next, cobalt is implanted into the DLC film at 25 keV and a dose of $3\times10^{16}$ ions/$cm^2$ by an ion implantation method.

(Step 4)

Next, an $SiO_2$ film having a thickness (h) of 1 μm to form an insulating layer 61 and a Ta film having a thickness of 100 nm to form the gate electrode 3 are deposited in succession.

(Step 5)

A positive type photo resist (AZ1500; produced by Clariant K. K.) is formed by spin coating. Then, a photo mask pattern is exposed and developed by a photolithography method to form a mask pattern.

(Step 6)

The gate electrode 3 made of Ta is dry-etched with a $CF_4$ gas using the mask pattern as a mask. Then, the $SiO_2$ film 17 is etched using buffered hydrofluoric acid to form an opening having w=5 μm.

(Step 7)

The mask pattern is completely removed.

(Step 8)

Next, heat treatment is performed by lamp heating at 550° C. for 60 minutes in a 0.1%-acetylene atmosphere (99.9%-hydrogen). Therefore, the electron-emitting device of this example is completed.

The surface of the carbon layer 5 in this example is very flat and the Root-Mean-Square surface roughness was 0.5 nm (which is measured in the case where only the film is deposited on the Si substrate and treatment is performed).

The electron-emitting device having such a structure is placed in the vacuum chamber as in Examples 1 and 2. As in Example 1, the anode electrode 4 in which the phosphor is located on the ITO electrode is used. The distance H is set to 2 mm.

Then, the maximum applied voltage is provided to the electron-emitting device in the step shown in FIG. 10A. Va is set to 10 kV. With respect to the pulse voltage Vg, the pulse width is set to 5 msec., the repetition frequency is set to 40 Hz, the duty ratio is set to 20%, and Vg2 is set to 35 V.

Therefore, the threshold value required for electron emission was originally 8 V and then increased to 15 V.

The pulse width modulation driving shown in FIG. 10C is performed with the same arrangement in the vacuum chamber. At this time, Vg3 is set to 30 V. According to this step, the luminance of the phosphor which is the anode electrode 4 is obtained according to the pulse width.

The electron-emitting device in this example becomes a device which includes the carbon layer 5 having a high flatness and emits electrons at a low threshold electric field. The electric field required at driving was 20 V/μm.

In this example, cobalt particles implanted into the DLC film are coagulated by anneal processing in the gas atmosphere in (Step 8), so that cobalt having a crystalline structure is partially formed in the carbon layer 5. As a result, the aggregation 9 of the cobalt particles is partially formed in the carbon layer 5. A state of the DLC film after the anneal processing changes from that of the DLC film at the film formation. According to the TEM observation, the DLC film partially has a graphite structure.

The aggregation of the cobalt particles partially increases conductivity. Therefore, electrons near the cobalt particles are easy to reach the surface rather than the other regions. In addition, the aggregation of the cobalt particles has a structure in which an electric field is easy to concentrate on its tip because of a difference of a dielectric constant with the DLC film. Therefore, the entire aggregation has a structure in which electrons are easy to emit.

Even in this example, the stable electron emission from the electron-emitting film having high flatness is caused as in Examples 1 and 2.

The electron-emitting film is a thin film and has high flatness. Therefore, even when the insulating layer 61, the gate electrode 3, and the like are stacked on the electron-emitting film, there is no fear that those film are peeled, so that the electron-emitting device is preferably produced.

According to the carbon layer in this example, the discrete emission sites are obtained. The emission site density can be determined according to a concentration of implanted cobalt and a size of a formed cobalt particle.

In this example, cobalt is used as the electroconductive particle. Another metallic particle can be used. The base is not limited to the DLC film.

In the electron-emitting structure of this example, the electric field Eg applied by the gate electrode is determined according to not an opening diameter w but a thickness h of the insulating layer 61. Therefore, there is a possibility that a short distance of 1 μm or less can be easily set as compared with the structure described in Example 1. In this case, there is a possibility that the drive voltage can be further reduced. The electron beam diameter depends on the opening diameter w, so that the beam size can be reduced by reducing the opening diameter w.

A large number of openings may be provided to each electron-emitting device. A shape of the opening is not limited to a circle and therefore another shape such as a rectangle can be selected.

According to the electron-emitting device produced in this example, although the electron emission is possible at a low electric field, the stable electron-emitting characteristic can be obtained for a long period.

EXAMPLE 4

In this embodiment, an image display. apparatus is manufactured using an electron source substrate 41 in which 1000 (row direction)×1000 (column direction) electron-emitting devices produced in Example 2 are arranged in matrix.

As shown in FIG. 12, with respect to the wirings 42 and 43, the X-directional wiring 42 is connected with the cathode electrode 2 and the Y-directional wiring 43 is connected with the gate electrode 3. The respective electron-emitting devices 44 are arranged with pitches of 300 μm in a. row direction and 300 μm in a column direction.

The electron source base 41 is produced and then fixed to the rear plate 51. After that, the rear plate 51 is opposed to the face plate 56 having the metal back 55 serving as the anode electrode 4 and the phosphor film 54 and seal-bonding is performed through the support frame 52 to produce the panel (envelope) 57 shown in FIG. 13.

In such a state, the step for providing the maximum applied field Emax is performed. At this time, Vg2 [V] is applied between the cathode electrode 2 and the gate electrode in each of all the electron-emitting devices 44. Values of the emission current Ie in the respective electron-emitting devices 44 are stored in a memory. Then, the characteristic adjusting step is performed so as to obtain a substantially uniform amount of Ie in the respective electron-emitting devices 44 and the same electron emission amount. Note that, the voltage applied between the cathode electrode 2 and the gate electrode 3 in the characteristic adjusting step is higher than Vg2 [V].

After that, the pulse width modulation is performed at a voltage lower than Vg2 [V], which is applied to each of the electron-emitting devices 44, thereby displaying an image.

As a result, the image display apparatus in which matrix driving is possible and the uniformity is high can be produced. In addition, driving is stable for a long time.

As described above, according to the present invention, the electron-emitting device in which the threshold value is low and the electron-emitting characteristic is stable can be manufactured. In addition, the electron source and the image display apparatus, in which the characteristic is stable and the uniformity is high, can be realized.

What is claimed is:

1. A method of manufacturing an electron-emitting device, comprising the steps of:

preparing a cathode electrode including a carbon layer which has a dipole layer at a surface or on a surface of the carbon layer, and an extraction electrode located apart from the cathode electrode; and applying a voltage higher than a voltage to be applied to the electron-emitting device at driving of the electron-emitting device between the extraction electrode and the cathode electrode, wherein the carbon layer contains hydrogen such that a ratio of hydrogen with respect to carbon in the carbon layer is not smaller than 0.1 atm % and not larger than 20 atm %.

2. The method of manufacturing an electron-emitting device according to claim 1, wherein said carbon layer has a Root-Mean-Square surface roughness equal to or smaller than 1/10 of a film thickness of the carbon layer.

3. The method of manufacturing an electron-emitting device according to claim 1, wherein said carbon layer has a Root-Mean-Square surface roughness equal to or smaller than 10 nm.

4. The method of manufacturing an electron-emitting device according to claim 1, wherein a surface of the carbon layer is substantially flat.

5. The method of manufacturing an electron-emitting device according to claim 1, wherein an electric field smaller than $1\times10^6$ V/cm is applied between the carbon layer and the extraction electrode to emit an electron from the carbon layer.

6. The method of manufacturing an electron-emitting device according to claim 1, wherein the carbon layer has a positive electron affinity.

7. The method of manufacturing an electron-emitting device according to claim 1, wherein the dipole layer comprises hydrogen terminating the surface of the carbon layer.

8. The method of manufacturing an electron-emitting device according to claim 1, wherein the carbon layer comprises a carbon base and a plurality of electroconductive particles dispersed in the carbon base.

9. The method of manufacturing an electron-emitting device according to claim 8, wherein the electroconductive particles are arranged in a thickness direction of the carbon layer, and a resistivity of the carbon base is higher than that of the electroconductive particles.

10. The method of manufacturing an electron-emitting device according to claim 4, wherein an electric field smaller than $1\times10^6$ V/cm is applied between the carbon layer and the extraction electrode to emit an electron from the carbon layer.

11. The method of manufacturing an electron-emitting device according to claim 5, wherein a surface of the carbon layer is terminated with hydrogen.

12. The method of manufacturing an electron-emitting device according to claim 10, wherein a surface of the carbon layer is terminated with hydrogen.

13. The method of manufacturing an electron-emitting device according to claim 12, wherein the carbon layer comprises a carbon base and a plurality of electroconductive particles dispersed in the carbon base.

14. The method of manufacturing an electron-emitting device according to claim 13, wherein the electroconductive particles are arranged in a thickness direction of the carbon layer, and a resistivity of the carbon base is higher than that of the electroconductive particles.

15. The method of manufacturing an electron-emitting device according to claim 7, wherein the carbon layer comprises a carbon base and a plurality of electroconductive particles dispersed in the carbon base.

16. The method of manufacturing an electron-emitting device according to claim 15, wherein the electroconductive particles are arranged in a thickness direction of the carbon layer, and a resistivity of the carbon base is higher than that of the electroconductive particles.

17. A method of manufacturing an image display apparatus including an anode electrode and a plurality of electron-emitting devices, each of which is located apart from the anode electrode and located on a substrate surface, comprising the steps of:

(A) preparing a plurality of electron-emitting devices on a substrate surface, each of the plurality of electron-emitting devices comprising a cathode electrode, a carbon layer which has a dipole layer at a surface or on a surface of the carbon layer located on the cathode electrode, and a gate electrode located apart from the cathode electrode;

(B) selecting an electron-emitting device from the plurality of electron-emitting devices; and (C) applying a voltage higher than a voltage to be applied at driving of the selected electron-emitting device between the gate electrode and the cathode electrode of the selected electron-emitting device, wherein the carbon layer contains hydrogen such that a ratio of hydrogen with respect to carbon in the carbon layer is not smaller than 0.1 atm % and not larger than 20 atm %.

18. The method of manufacturing an image display apparatus according to claim 17, wherein the (C) step is performed so as to reduce a difference of emission characteristics among the plurality of electron-emitting devices.

19. The method of manufacturing an image display apparatus according to claim 17, wherein said carbon layer has a Root-Mean-Square surface roughness equal to or smaller than 1/10 of a film thickness of the carbon layer.

20. The method of manufacturing an image display apparatus according to claim 17, wherein said carbon layer has a Root-Mean-Square surface roughness equal to or smaller than 10 nm.

21. The method of manufacturing an image display apparatus according to claim 17, wherein a surface of the carbon layer is substantially flat.

22. The method of manufacturing an image display apparatus according to claim 17, wherein an electric field smaller than $1\times10^6$ V/cm is applied between the carbon layer and the extraction electrode to emit an electron from the carbon layer.

23. The method of manufacturing an image display apparatus according to claim 22, wherein the dipole layer comprises hydrogen terminating the surface of the carbon layer.

24. The method of manufacturing an image display apparatus according to claim 23, wherein the carbon layer comprises a carbon base and a plurality of electroconductive particles dispersed in the carbon base.

25. The method of manufacturing an image display apparatus according to claim 24, wherein the electroconductive particles are arranged in a thickness direction of the carbon layer, and a resistivity of the carbon base is higher than that of the electroconductive particles.

26. The method of manufacturing an image display apparatus according to claim 17, wherein the carbon layer has a positive electron affinity.

27. The method of manufacturing an image display apparatus according to claim 17, wherein the carbon layer comprises a carbon base and a plurality of electroconductive particles dispersed in the carbon base.

28. The method of manufacturing an image display apparatus according to claim 27, wherein the electroconductive particles are arranged in a thickness direction of the carbon layer, and a resistivity of the carbon base is higher than that of the electroconductive particles.

29. The method of manufacturing an image display apparatus according to claim 21, wherein an electric field smaller than $1\times10^6$ V/cm is applied between the carbon layer and the extraction electrode to emit an electron from the carbon layer.

30. The method of manufacturing an image display apparatus according to claim 29, wherein the surface of the carbon layer is terminated with hydrogen.

31. The method of manufacturing an image display apparatus according to claim 30, wherein the carbon layer comprises a carbon base and a plurality of electroconductive particles dispersed in the carbon base.

32. The method of manufacturing an image display apparatus according to claim 31, wherein the electroconductive particles are arranged in a thickness direction of the carbon layer, and a resistivity of the carbon base is higher than that of the electroconductive particles.

33. A method of driving an image display apparatus including a plurality of electron-emitting devices and a light-emitting member, wherein a drive voltage to be applied to each of the plurality of electron-emitting devices is equal to or smaller than a voltage applied to each of the plurality of electron-emitting devices at manufacturing of the plurality of electron-emitting devices;

wherein each of the plurality of electron-emitting devices comprises a cathode electrode on which a carbon layer is disposed, hydrogen terminating a surface of the carbon layer, and a gate electrode located apart from the cathode electrode, and wherein the carbon layer contains hydrogen such that a ratio of hydrogen with respect to carbon in the carbon layer is not smaller than 0.1 atm % and not larger than 20 atm %.

34. A method of adjusting electron emission characteristics of an electron-emitting device, comprising the steps of:

preparing an electron-emitting device comprising a cathode electrode on which a carbon layer is disposed, hydrogen terminating a surface of the carbon layer, and an extraction electrode spaced from the cathode electrode; and applying, between the extraction electrode and the cathode electrode, an adjusting voltage for adjusting the electron emission characteristics of the electron-emitting device, wherein the adjusting voltage is higher than a voltage to be applied between the extraction electrode and the cathode electrode at a normal driving for emitting an electron from the carbon layer, and wherein the carbon layer contains hydrogen such that a ratio of hydrogen with respect to carbon in the carbon layer is not smaller than 0.1 atm % and not larger than 20 atm %.

35. A method of manufacturing an electron-emitting device, comprising the steps of:

(A) preparing (i) a cathode electrode having a carbon layer and (ii) an extraction electrode located apart from the cathode electrode, wherein each of carbon atoms of a surface of the carbon layer is bonded to hydrogen atom, and wherein 0.1 atm% or more of hydrogen with respect to carbon in the carbon layer is contained in the carbon layer; and (B) applying a voltage higher than a voltage to be applied to the electron-emitting device at driving of the electron-emitting device between the extraction electrode and the cathode electrode.

36. A method of manufacturing an electron-emitting device, comprising the steps of:

(A) preparing, on a cathode electrode, an amorphous carbon layer, a surface of which is hydrogen terminated, wherein the amorphous carbon layer (i) contains a plurality of metal particles each of which contains at least one metal selected from a group of Co, Ni, and Fe, and (ii) has a resistivity of $1\times10$ ohm cm to $1\times10^{14}$ ohm cm; and (B) arranging an extraction electrode spaced from the cathode electrode, and applying a voltage higher than a voltage to be applied to the electron-emitting device at driving of the electron-emitting device between the extraction electrode and the cathode electrode.

* * * * *

UNITED STATES PATENT AND TRADEMARK OFFICE

CERTIFICATE OF CORRECTION

PATENT NO. : 7,405,092 B2
APPLICATION NO. : 10/885803
DATED : July 29, 2008
INVENTOR(S) : Michiyo Nishimura It is certified that error appears in the above-identified patent and that said Letters Patent is hereby corrected as shown below:

ON TITLE PAGE [56] REFERENCES CITED

Other Publications, “Mterials” should read --Materials--.

COLUMMN 1

Line 58, “a” should read --an--.

COLUMN 2

Line 30, “are” should read --is--; and
Line 47, “the-present” should read --the present--

COLUMN 3

Line 27, “a differences” should read --a difference--.

COLUMN 5

Line 7, “on-a” should read --on a--;
Line 16, “cross sectional” should read --cross-sectional--;
Line 33, “in” should read --in the--;
Line 36, “carbon-layer 5” should read --carbon layer 5--;
Line 42, “As regards another elements,” should read --In regards to another element,--; and
Line 53, “is” should read --are--.

COLUMN 6

Line 2, “of” should read --of the--; and
Line 25, “diamond like” should read --diamond-like--.

COLUMN 9

Line 29, “film” should read --film, which--; and
Line 45, “an” should read --a--.

UNITED STATES PATENT AND TRADEMARK OFFICE

CERTIFICATE OF CORRECTION

PATENT NO. : 7,405,092 B2
APPLICATION NO. : 10/885803
DATED : July 29, 2008
INVENTOR(S) : Michiyo Nishimura It is certified that error appears in the above-identified patent and that said Letters Patent is hereby corrected as shown below:

COLUMN 10

Line 4, "priciple" should read --principle--; and
Line 6, "shown" should read --shown in--.

COLUMN 11

Line 1, "carbon layer 5" should read --carbon layer 5,--; and
Line 2, "6" should read --6,--; and "comprising" should read --comprised of--.

COLUMN 14

Line 37, "that" should read --the fact that--.

COLUMN 16

Line 62, "becomes" should read --and becomes--.

COLUMN 17

Line 36, "devices" should read --devices are--;
Line 38, "composing" should read --composed--;
Line 42, "composing" should read --composed--; and
Line 58, "formed" should read --are formed--.

COLUMN 18

Line 43, "FIGS. 13" should read --FIG. 13.--; and
Line 57, "a" should read --and a--.

COLUMN 19

Line 2, "another" should read --other--;
Line 38, "an" should be deleted;
Line 41, "an" should be deleted; and "a" should be deleted;
Line 44, "invention" should read --invention,--;
Line 47, "case" should read --the case--; and
Line 58, "following" should read --the following--.

UNITED STATES PATENT AND TRADEMARK OFFICE

CERTIFICATE OF CORRECTION

PATENT NO. : 7,405,092 B2
APPLICATION NO. : 10/885803
DATED : July 29, 2008
INVENTOR(S) : Michiyo Nishimura It is certified that error appears in the above-identified patent and that said Letters Patent is hereby corrected as shown below:

COLUMN 21

Line 21, “quarts” should read --quartz--; and
Line 26, “quarts” should read --quartz--.

COLUMN 23

Line 27, “is-a” should read --is a--.

COLUMN 25

Line 8, “display.” should read --display--;
Line 55, “voltage higher” should read --voltage between the extraction electrode and the cathode electrode, wherein the voltage is higher--; and “to the” should be deleted;
Line 56, should be deleted;
Line 57, “ing device” should be deleted;
Line 58, “cathode electrode,” should read --cathode electrode at driving of the electron-emitting device, and--; and
Line 62, “0.1 atm %” should read --0.1 atom %--; and “atm %.” should read --atom%.--.

COLUMN 27

Line 3, “voltage higher” should read --voltage between the gate electrode and the cathode electrode of the selected electron-emitting device, wherein the voltage is higher--;
Line 4, should be deleted;
Line 5, “electrode of” should read --electrode at driving of--;
Line 6, “device,” should read --device, and--;
Line 9, “0.1 atm %” should read --0.1 atom %--; and
Line 10, “atm %.” should read --atom %.--.

COLUMN 28

Line 5, “wherein” should be deleted;
Line 6, “a” should read --wherein a--;
Line 18, “0.1 atm %” should read --0.1 atom %--;
Line 19, “atm %.” should read --atom %.--;
Line 36, “0.1 atm %” should read --0.1 atom %--;

UNITED STATES PATENT AND TRADEMARK OFFICE

CERTIFICATE OF CORRECTION

PATENT NO. : 7,405,092 B2
APPLICATION NO. : 10/885803
DATED : July 29, 2008

INVENTOR(S) : Michiyo Nishimura

It is certified that error appears in the above-identified patent and that said Letters Patent is hereby corrected as shown below:

COLUMN 28 (cont'd)

Line 37, "atm %." should read --atom %.--;
Line 44, "bonded to hydrogen atom," should read --hydrogen terminated,--;
Line 45, "0.1 atm % or more" should read --0.1 atom % or more and not larger than 20 atom %--;
Line 48, "higher than a voltage to be applied" should be deleted;
Line 49, should be deleted;
Line 50, "emitting device" should be deleted;
Line 51, "electrode." should read --electrode, wherein the voltage is higher than a voltage to be applied between the extraction electrode and the cathode electrode at driving of the electron-emitting device.--;
Line 56, "(i)" should be deleted;
Line 57, "each of which contains" should read --the plurality of metal particles including--; and "particles" should read --particles,--;
Line 58, "of" should read --that includes--;
Line 59, "(ii)" should read --wherein the amosphorus carbon layer--; and "resistivity of 1x10 ohm cm" should read --resistivity within a range of $1x10^1$ ohm cm--;
Line 62, "higher than a volt-" should be deleted;
Line 63, should be deleted;
Line 64, "ing of the electron-emitting device" should be deleted; and
Line 65, "electrode." should read --electrode, wherein the voltage is higher than a voltage to be applied between the extraction electrode and the cathode electrode at driving of the electron-emitting device.--.

Signed and Sealed this

Twenty-fourth Day of February, 2009

JOHN DOLL
*Acting Director of the United States Patent and Trademark Office*